(12) United States Patent
Kusunoki et al.

(10) Patent No.: US 7,343,273 B2
(45) Date of Patent: Mar. 11, 2008

(54) PISTON DESIGN SUPPORT PROGRAM, DESIGN SUPPORT METHOD, AND DESIGN SUPPORT APPARATUS

(75) Inventors: Yasutomo Kusunoki, Hiroshima-ken (JP); Kazuhiro Tomizawa, Hiroshima-ken (JP); Mitsuo Mimura, Hiroshima-ken (JP)

(73) Assignee: Mazda Motor Corporation, Hiroshima (JP)

( * ) Notice: Subject to any disclaimer, the term of this patent is extended or adjusted under 35 U.S.C. 154(b) by 698 days.

(21) Appl. No.: 10/736,846

(22) Filed: Dec. 17, 2003

(65) Prior Publication Data

US 2004/0128011 A1    Jul. 1, 2004

(30) Foreign Application Priority Data

Dec. 20, 2002 (JP) ............................. 2002-370224
Sep. 24, 2003 (JP) ............................. 2003-332382

(51) Int. Cl.
*G06G 7/48* (2006.01)
(52) U.S. Cl. .............................................. 703/7; 703/6
(58) Field of Classification Search .................... 703/6, 703/7; 345/441–443, 420
See application file for complete search history.

(56) References Cited

U.S. PATENT DOCUMENTS 5,341,461 A * 8/1994 Kikuchi et al. ............. 345/420
5,701,403 A * 12/1997 Watanabe et al. ........... 345/419
5,945,995 A * 8/1999 Higuchi et al. ............. 345/420
6,219,049 B1 * 4/2001 Zuffante et al. ............. 715/764

OTHER PUBLICATIONS

Haberamn, Aug. 2000, Creating Parametric Models using ANSYS, Collaborative Solution Inc.*
T. Bogard, "Optimized Tolerances Make Good Products Better", Machine Design, vol. 74, No. 5, Mar. 2002, pp. 104-112, XP009065157.
Ana C. Thornton et al. "CADET: A Software Support Tool for Constraint Processes in Embodiment Design", Research in Engineering Design, vol. 8, No. 1, Mar. 1996, pp. 1-13, XP009065076.
Anna C. Thornton, "A Support Tool for Constraint Processes in Embodiment Design", 6th International Conference on Design Theory and Methodology, Sep. 1994, pp. 231-239, XP009065075.
L. Lin, et al, "Constraints Modelling in Product Design", J. Eng. Design, vol. 13, No. 3, Sep. 2002, pp. 205-214, XP009065228.
J.D. Cohen, et al., I-Collide: "An Interactive and Exact Collision Protection System for Large-Scale Environments", Proceedings of the 1995 Symposium on Interactive 3D Graphics, 1995, pp. 189-196 and 218, XP002376868.

(Continued)

*Primary Examiner*—Paul Rodriguez
*Assistant Examiner*—Eunhee Kim

(57) ABSTRACT

According to this invention, a piston design support program for supporting design of a piston shape of an internal combustion engine, makes a computer execute an input step of inputting specification values associated with a piston shape, a verification step of verifying, based on the input specification values, whether or not gaps between the piston and its surrounding components are appropriate, a read step of reading out, when it is determined in the verification step that the gaps are appropriate, a three-dimensional piston model which can be deformed according to a predetermined rule from a database, and a deformation step of deforming the piston model on the basis of the specification values.

23 Claims, 20 Drawing Sheets

OTHER PUBLICATIONS

R.H. Bracewell et al., "From Embodiment Generation to Virtual Prototyping", International Conference on Engineering Design Iced 99, Aug. 1999, XP002376864.

R.E. Barr, et al., "The New Digital Engineering Design and Graphics Process", Engineering Design Graphics Journal, vol. 66, No. 3, Aug. 2002, pp. 6-11, XP002376865.

A. Csabai et al., "Container Spaces and Functional Features for Top-Down 3D Layout Design", Computer Aided Design, Elsevier Publishers by, Barking, GB, vol. 34, No. 13, Nov. 2002, pp. 1011-1035, XP004366884.

Mike Osenga, "Virtual Prorotyping Software", Diesel Progress Engines & Drives, vol. 62, No. Feb. 2, 1996, pp. 10-13, XP009065155.

European Search Report, dated May 9, 2006.

* cited by examiner

FIG. 4A

| SPECIFICATION VALUE INPUT | | | |
|---|---|---|---|
| TARGET VALUE | TARGET COMPRESSION RATIO : [**] | | |
| | MINIMUM THICKNESS REFERENCE : [*] mm | TARGET CLEARANCE REFERENCE : [*] mm | |
| CAM LIFT DATA | INTAKE SIDE : [/.txt] | EXHAUST SIDE : [/.txt] | |
| VALVE TIMING | INTAKE SIDE : []°CA | EXHAUST SIDE : []°CA | |
| LAYOUT CONDITION | BORE DIAMETER : [] mm | CRANK DIAMETER : [] mm | |
| | CONNECTING ROD LENGTH : [] mm | C/W VIRTUAL DISK RADIUS : [] mm | |
| | COMBUSTION CHAMBER CAPACITY : [] cc | VALVE CENTER HEIGHT : [] mm | |
| | INTAKE VALVE ANGLE : []° | EXHAUST VALVE ANGLE : []° | |
| PISTON SPECIFICATION VALUE | PISTON DIAMETER : [**] mm | | |
| | INTAKE RECESS CENTER : [] mm | EXHAUST RECESS CENTER : [] mm | |
| | INTAKE RECESS DEPTH : [] mm | EXHAUST RECESS DEPTH : [] mm | |
| | CROWN THICKNESS : [**] mm | | |
| | ... | | |
| | DIMENSION INDICATING SHAPE OF SKIRT INNER SPACE | | |
| | DIMENSION INDICATING SHAPE OF SKIRT OUTER SPACE | | |
| | DIMENSION INDICATING POSITION AND SHAPE OF RING GROOVE | | |
| | DIMENSION INDICATING POSITION AND SHAPE OF PIN HOLE | | |
| VALVE SPECIFICATION VALUE | INTAKE VALVE DIAMETER : [] mm | EXHAUST VALVE DIAMETER : [] mm | |

400

F I G. 19
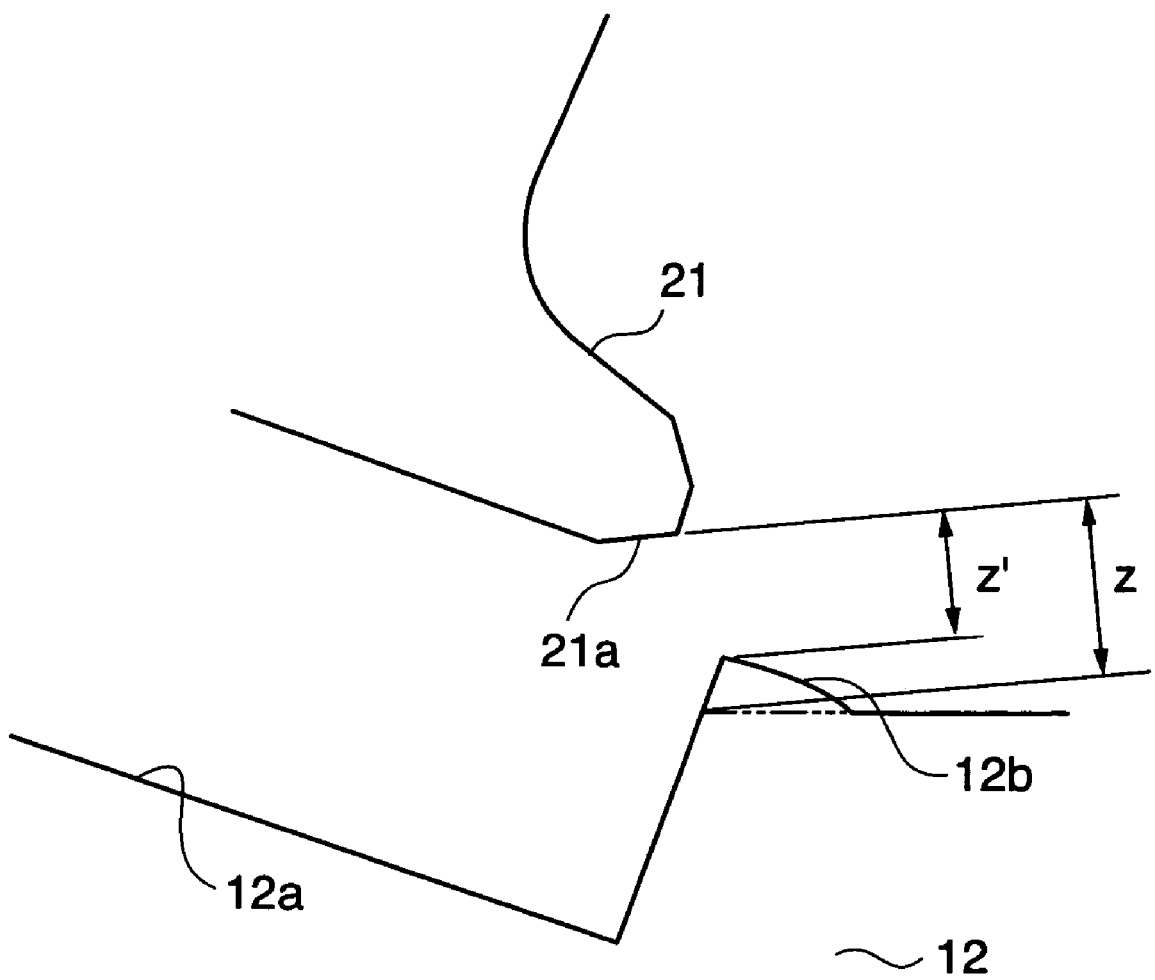

PISTON DESIGN SUPPORT PROGRAM, DESIGN SUPPORT METHOD, AND DESIGN SUPPORT APPARATUS

FIELD OF THE INVENTION

The present invention relates to a design support program, a design support method, and a design support apparatus, which allow a computer to support design of a piston shape.

BACKGROUND OF THE INVENTION

Conventionally, various piston designs have been made in correspondence with places of destination and engine displacements (e.g., Japanese Patent Publication No. 7-86336). Since the shape of a piston can be changed more easily than a cylinder block and the like, the piston shape often undergoes flexible design changes for the purpose of realizing a target compression ratio, emission performance, and the like.

It is a common practice to design a piston using computer software such as CAD and the like.

However, conventionally, either of a method of creating a two-dimensional (2D) design drawing alone and a method of creating three-dimensional (3D) data that represents the shape of the entire piston from the beginning, and converting it into 2D data is adopted.

However, in case of piston design, only 3D view allows verification of interference among surrounding components. Nevertheless, if verification is made upon forming the shape of the entire piston on a 3D space from the start, when a problem is detected as a result of verification, the re-design load is heavy, resulting in poor design efficiency.

SUMMARY OF THE INVENTION

The present invention enables to provide a technique that can improve the piston design efficiency.

According to the present invention, the foregoing problem is solved by providing a piston design support program for supporting design of a piston shape of an internal combustion engine, the program making a computer execute:

an input step of inputting specification values associated with a piston shape;

a verification step of verifying, based on the input specification values, whether or not gaps between the piston and surrounding components thereof are appropriate;

a read step of reading out, when it is determined in the verification step that the gaps are appropriate, a three-dimensional piston model which can be deformed according to a predetermined rule from a database; and a deformation step of deforming the piston model on the basis of the specification values.

Other features and advantages of the present invention will be apparent from the following description taken in conjunction with the accompanying drawings, in which like reference characters designate the same or similar parts throughout the figures there.

BRIEF DESCRIPTION OF THE DRAWINGS

FIGS. 4A and 4B show windows displayed by the piston design support system according to the first embodiment of the present invention;

FIG. 19 is a view for explaining a change in gap between a recess and valve due to the presence of a crown according to the second embodiment of the present invention.

DETAILED DESCRIPTION OF THE PREFERRED EMBODIMENTS

Preferred embodiments of the present invention will now be described in detail with reference to the drawings. It should be noted that embodiments to be described hereinafter are examples of implementation means of the present invention, and the present invention includes corrected or modified ones of the embodiments without departing from the scope of the invention. In this specification, a piston model is an object which is expressed by coordinate data of a plurality of points that express the piston shape, and the correlation among the respective points. Also, specification values include the dimensions and reference values that determine the shapes and positions of a piston and surrounding components, and the performance values of the piston.

First Embodiment (Piston and its Design)

Figure 10:
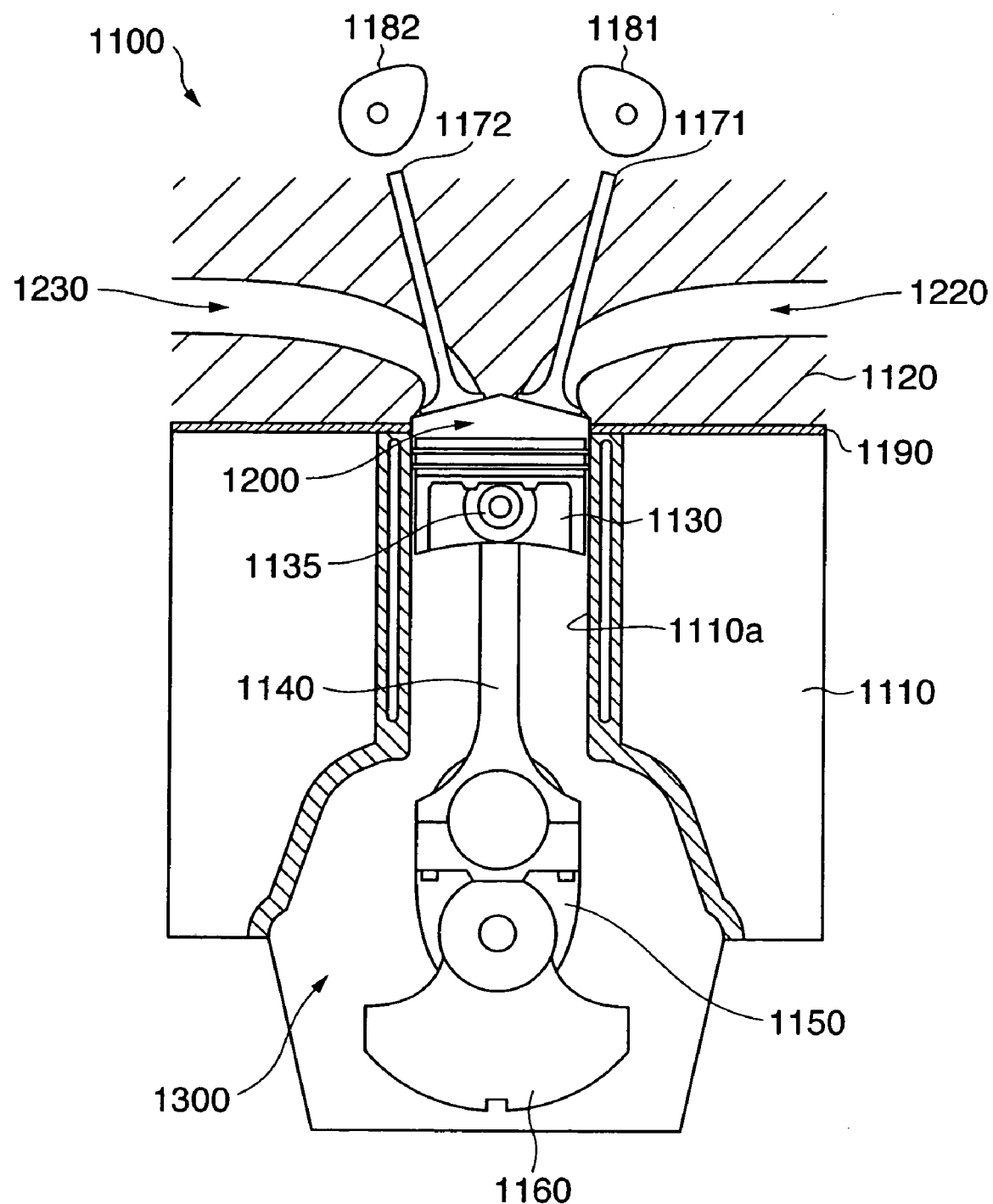
FIG. 10 is a schematic view showing the configuration of an engine comprising a piston which can be designed using the piston design support system according to the first embodiment of the present invention.

FIG. 10 shows an example of a piston and surrounding components, which can be designed by a support system according to the first embodiment of the present invention.

A piston and its surrounding components which are to be designed by the piston design support program will be explained first using FIG. 10.

Referring to FIG. 10, reference numeral 1100 denotes a four-valve, four-cycle gasoline engine (to be simply referred to as an engine hereinafter). The engine 1100 comprises a cylinder block 1110 having a cylinder 1110a, a cylinder head 1120 mounted on the top surface of the cylinder block 1110, a piston 1130 reciprocally fitted in the cylinders 1110a, a connecting rod 1140 attached to the piston 1130, a pin 1135 that connects the piston 1130 and connecting rod 1140, a crank 1150 that supports the connecting rod 1140, and a counter weight (to be also abbreviated as C/W hereinafter) which is attached to the crank 1150 on the side opposite to the connecting rod 1140. A gasket (to be also abbreviated as GSKT hereinafter) 1190 is sandwiched between the cylinder block 1110 and cylinder head 1120. In the cylinder 1110a, a combustion chamber 1200 surrounded by the piston 1130 and cylinder head 1120 is formed, and is partitioned from a crank case 1300 that houses the crank 1150 on the other side of the piston 1130.

The cylinder head 1120 is formed with intake and exhaust ports 1120 and 1230, and has an intake valve 1171 that opens/closes the opening of the intake port 1120 on the combustion chamber 1200 side, and an exhaust valve 1172 that opens/closes the opening of the exhaust port 1230 on the combustion chamber 1200 side. The intake valve 1171 reciprocates upon rotation of an intake-side cam 1181, and the exhaust valve 1172 reciprocates upon rotation of an exhaust-side cam 1182.

FIG. 10 illustrates one intake valve 1171 and one exhaust valve 1172. However, two each valves are provided in practice as the four-valve engine.

Figure 11:
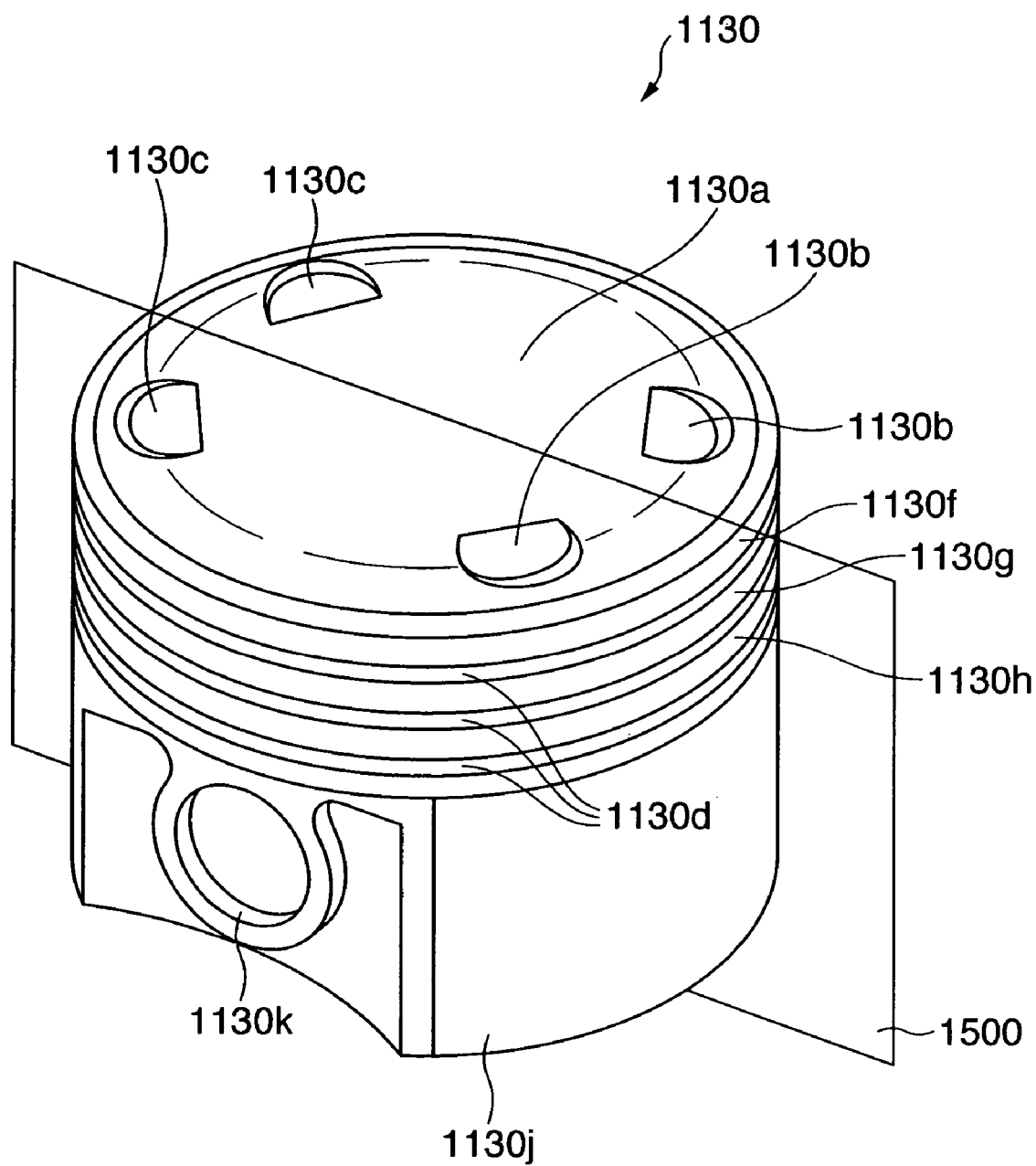
FIG. 11 is a schematic view showing a piston which can be designed using the piston design support system according to the first embodiment of the present invention.

FIG. 11 is a perspective view showing the outer appearance of the piston 1130 alone. As shown in FIG. 11, the outer rim portion of the top surface portion of the piston 1130 forms a flat shape perpendicular to the central axis of the piston 1130, and a crown 1130a which forms a circular shape viewed from the central axis direction of the piston 1130 is formed on a portion except for the outer rim portion.

Two recesses 1130b are formed at positions opposing the intake valves 1171 on the top surface portion of the piston 1130 to prevent the piston 1130 from interfering with (colliding against) the intake valves 1171. Likewise, two recesses 1130c are formed at positions opposing the exhaust valves 1172. The two recesses 1130b have the same shape, and the two recesses 1130c also have the same shape. For this reason, the piston 1130 can be divided into two portions that form mirror images by a plane 1500 passing through the central axis of the piston 1130.

Three piston ring grooves 1130d for receiving piston rings (to be referred to as a top ring, second ring, and oil ring in turn from the above) are formed near the top on the side circumferential surface of the piston 1130. Portions sandwiched between the neighboring piston ring grooves 1130d are called lands, which are respectively called a top land 1130f, second land 1130g, and third land 1130h in turn from the above. Furthermore, a lower portion of the piston is hollow, and its wall surface portion is called a skirt 1130j. A pin hole 1130k is formed in the skirt 1130j.

The crown 1130a has one of a convex (or dome) shape, flat shape, and concave (or cup) shape.

The volume of the combustion chamber 1200 shown in FIG. 10 changes depending on the shapes of the recesses 1130b and 1130c and the shape of the crown 1130a, and the compression ratio changes accordingly. On the contrary, the diameter, projecting height, and the like of the crown 1130a are determined in correspondence with a target compression ratio. That is, the recess shapes and crown shape must be adjusted, so that the capacity of the combustion chamber 1200 (the capacity when the piston 1130 is at its top dead center) assumes a value determined from the target compression ratio.

Upon designing such piston by a computer system such as CAD or the like, the piston shape is roughly determined on the basis of the dimensions that determine the shape of the piston, and relative positions with surrounding components. Furthermore, the piston shapes of detailed portions are determined in turn while verifying whether or not target performance values such as the target compression ratio, target mechanical strength, and the like are achieved. After the piston shapes of detailed portions are determined to some extent, high-precision calculations are made by CAE (Computer Aided Engineering) using that 3D shape data to make static stress calculations such as the rigidity of the skirt 1130j, the piston hole 1130k, and the like, thermal stress calculations of the crown 1130a, and behavior analysis upon reciprocating the piston 1130.

Since the high-precision calculation in CAE takes much time, it is important to thoroughly make verifications and to obtain an appropriate piston shape before being input to CAE as much as possible upon improving the piston design efficiency. Hence, this embodiment uses the following piston design support system.

(Overall System Arrangement)

The overall arrangement of the piston design support system according to the first embodiment of the present invention will be described below.

Figure 1:
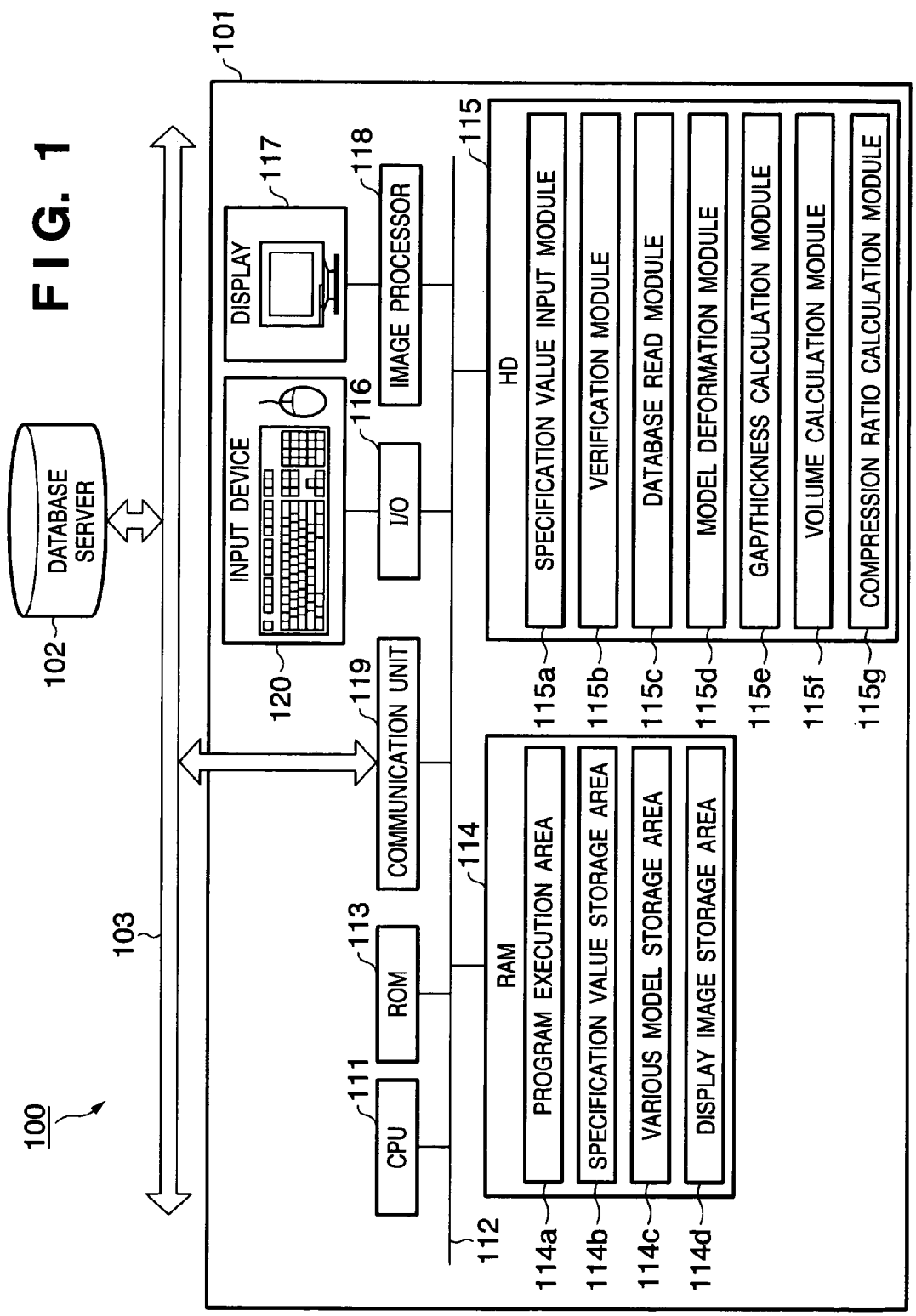
FIG. 1 is a schematic block diagram showing the arrangement of a piston design support system according to the first embodiment of the present invention.

FIG. 1 shows an example of the arrangement of a piston design support system 100 according to this embodiment. The piston design support system 100 shown in FIG. 1 includes a computer 101 serving as a piston design support apparatus, and a database server 102, which are connected via a local area network 103.

The computer 101 comprises, in its main body, a CPU 111, ROM (Read Only Memory) 113, RAM (Random Access Memory) 114, HD (Hard Disk) 115, input/output interface (I/O) 116, image processor 118, and communication unit 119, which are interconnected via a bus 112. An input device 120 and display 117 are provided outside the main body, and are respectively connected to the I/O 116 and image processor 118.

Of these components, the CPU 111 is an operation/control processor for controlling the overall computer 101. The ROM 113 is a nonvolatile memory which stores a boot program to be executed by the CPU 111, fixed values, and the like. The RAM 114 is a volatile memory which temporarily stores data and programs. Furthermore, the HD 115 is a storage medium serving as storage means that stores an OS and various program modules, which run on the computer 101. The I/O 116 is an interface used to input/output data between the computer main body and the input device 120.

The input device 120 includes devices such as a keyboard, mouse, and the like which are used to input commands and data. The display 117 is a device such as a liquid crystal display, CRT, or the like, which outputs text and image data that have undergone the arithmetic processes of the image processor 118 on the basis of control commands from the CPU 111. The image processor 118 is a unit which executes the arithmetic processes of image data to be displayed on the display 117. The communication unit 119 is a unit which exchanges data with the database server 102 via a wireless or wired communication line.

More specifically, the RAM 114 comprises a program execution area 114a for temporarily storing programs to be executed by the CPU 111 in the piston design support process, a specification value storage area 114b for temporarily storing specification value data input by the user, a various model storage area 114c for storing various models associated with a piston, and a display image storage area 114d for temporarily storing a display image.

The HD 115 stores program modules used to support piston design. More specifically, the HD 115 stores, as a piston design support program, a specification value input module 115a for inputting piston-related specification values, a verification module 115b for verifying whether or not specification values are appropriate, a database read module 115c for reading out various models from the database, a model deformation module 115d for deforming various models read out from the database on the basis of specification values, a gap/thickness calculation module 115e for calculating the piston-valve gap, the thickness of the crown back surface, and the like using the deformed piston models, a volume calculation module 115f for making various volume arithmetic operations using the deformed piston models and the like, and a compression ratio calculation module 115g for calculating the compression ratio using the combustion chamber volume calculated by the volume calculation module 115f.

Figure 2:
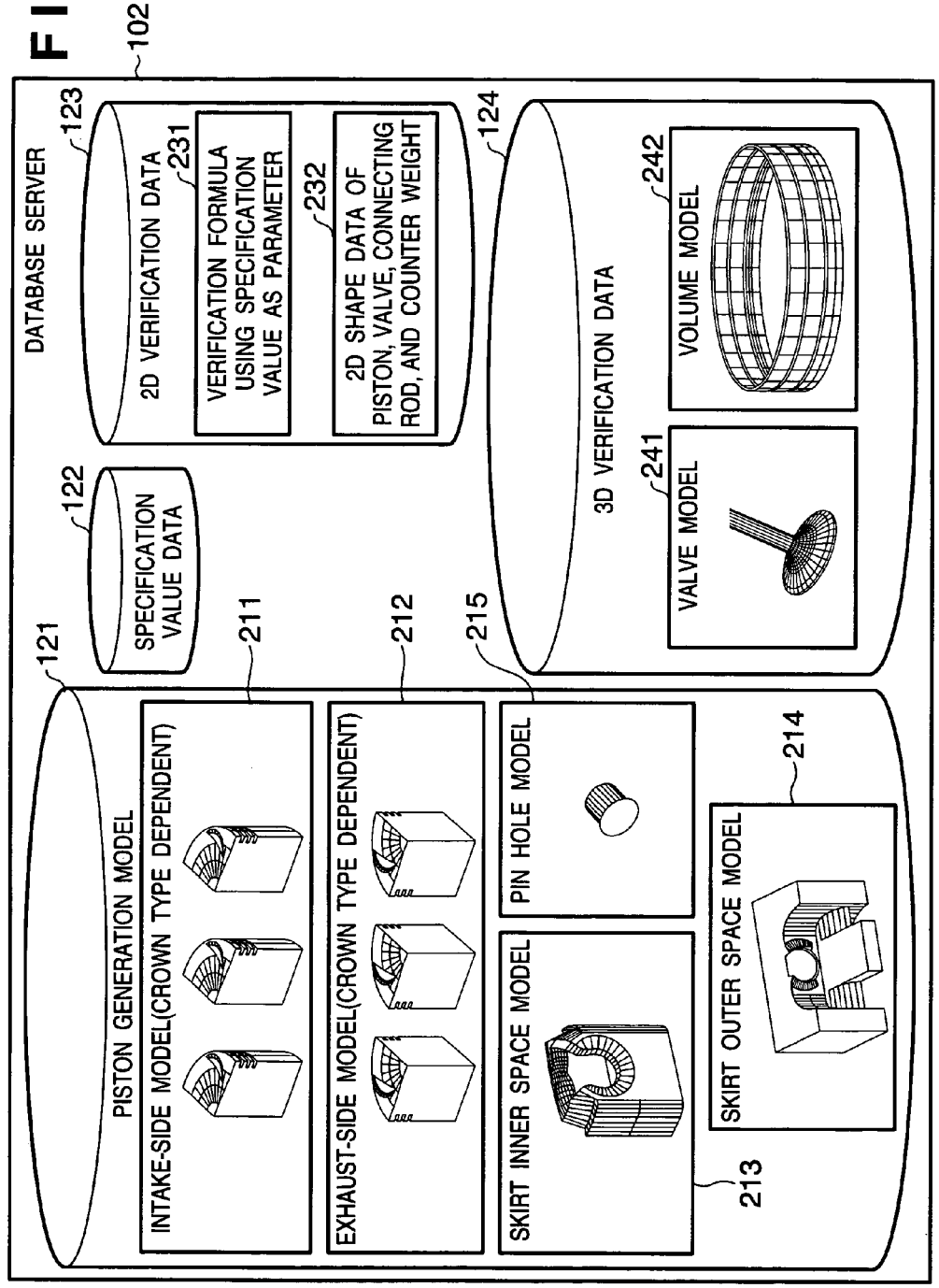
FIG. 2 is a diagram of a database included in the piston design support system according to the first embodiment of the present invention.

FIG. 2 shows various data stored in the database server 102. As shown in FIG. 2, the database server 102 includes piston generation models 121, specification value data 122, 2D verification data 123, and 3D verification data 124. The piston generation models 121 include an intake-side model 211, exhaust-side model 212, skirt inner space model 213, skirt outer space model 214, and pin hole model 215. The intake-side model 211 includes the intake-side recesses 1130b formed to prevent interference with the intake valves 1171. On the other hand, the exhaust-side model 212 includes the exhaust-side recesses 1130c formed to prevent interference with the exhaust valves 1172. The intake- and exhaust-side models 211 and 212 are segmented in correspondence with symmetry. The intake- and exhaust-side models 211 and 212 do not have any information about an internal space to be hollowed and an external space to be shaved in the skirt 1130j portion. That is, each of the intake- and exhaust-side models 211 and 212 has a ¼ columnar shape including one recess and a crown on its top portion, and ring grooves. The database server 102 stores a plurality of intake- and exhaust-side models 211 and 212 in correspondence with crown types as the piston generation model 121. That is, the intake- and exhaust-side models 211 and 212 included in the piston generation model 121 can be classified into three types, i.e., convex type, flat type, and concave type in correspondence with the crown types. Of course, the present invention is not limited to such specific classes. For example, the intake- and exhaust-side models 211 and 212 may be prepared while being classified into two types, i.e., convex and concave types, or being classified into four or more types in correspondence with the crown types. Also, the intake- and exhaust-side models 211 and 212 can also be called main body models each of which expresses the shape of the combustion chamber surface of the piston.

By contrast, the skirt inner space model 213 and skirt outer space model 214 are space models which represent the space shapes to be shaved from the main body model. The skirt inner space model 213 represents the shape inside the skirt 1130j of the piston 1130, and the skirt outer space model 214 represents the shape of the outer surface of the skirt 1130j of the piston 1130. The skirt inner space model 213 and skirt outer space model 214 are also segmented in correspondence with symmetry, and have shapes obtained by cutting actual skirt inner and outer spaces into ½ along a plane passing through the piston central axis. This cross section is the same as those included in the intake-side model 211 and exhaust-side model 212. Note that the top portion of the skirt inner space model 213 represents the shape of the crown back surface.

The pin hole model 215 is a model that represents the shape of the pin hole 1130k which receives the pin 1135 used to hold the connecting rod 1140.

The specification value data 122 include data associated with specification values input by the user. The 2D verification data 123 is used to verify the specification values input by the user using mathematical formulas and 2D data before generation of 3D data. The 2D verification data 123 includes verification formulas 231 using the specification values as parameters, and 2D shape models 232 that two-dimensionally express the piston 1130, valves 1171 and 1172, connecting rod 1140, and counter weight 1160.

The 3D verification model 124 includes a valve model 241 and volume model 242. The volume model 242 includes a volume model which represents a space between the outer circumferential surface of the piston and the inner circumferential surface of the cylinder near the piston ring fitting grooves. This volume model is classified into a plurality of ring volume models which represent spaces formed between the bottom surfaces of a plurality of piston ring fitting grooves and the inner circumferential surface of the cylinder, and land volume models between neighboring ring volume models.

(Piston Design Support Process)

Figure 3:
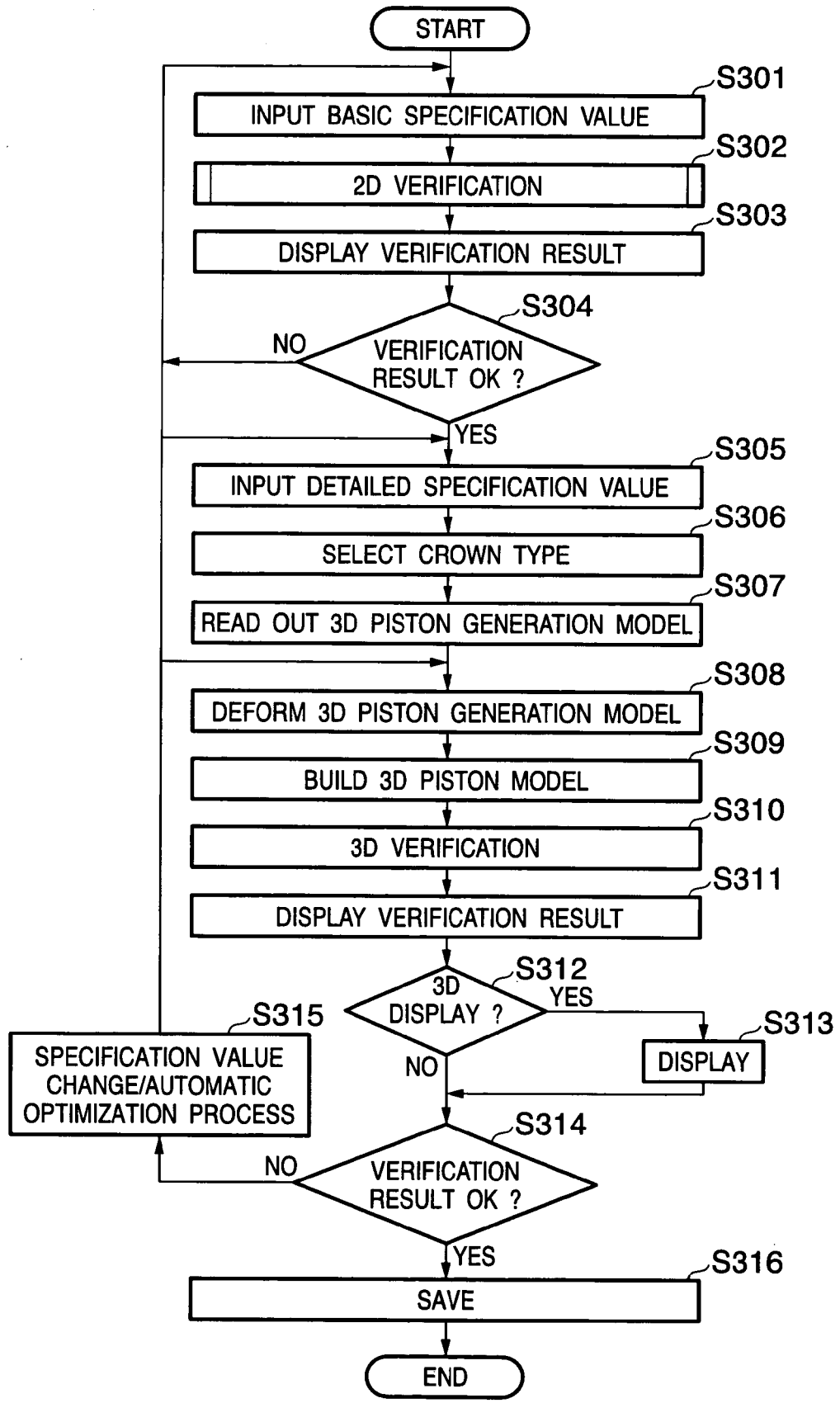
FIG. 3 is a flow chart showing the flow of a piston design support process according to the first embodiment of the present invention.

FIG. 3 roughly shows the process implemented by the piston design support program.

When the user launches the piston design support program and wants to design a piston, the piston design support program generates an input window of basic specification values associated with a piston shape by the specification value input module 115a, and displays it on the display 117. In this case, if a file name of the specification value data 122 is designated, the specification value data 122 are read out from the database server 102, and are set as basic specification values. If no file name is designated, the program prompts the user to input specification values one by one.

FIG. 4A shows an example of the basic specification value input window. The user can input the following values as basic specification values to a basic specification value input window 400 shown in FIG. 4A.

Minimum thickness reference: This field stores a minimum value that the thickness of the piston must satisfy.

Target clearance reference: This field stores a minimum value that a clearance between the surface of the piston and surrounding components such as the connecting rod, valves, and the like must satisfy.

Figure 5:
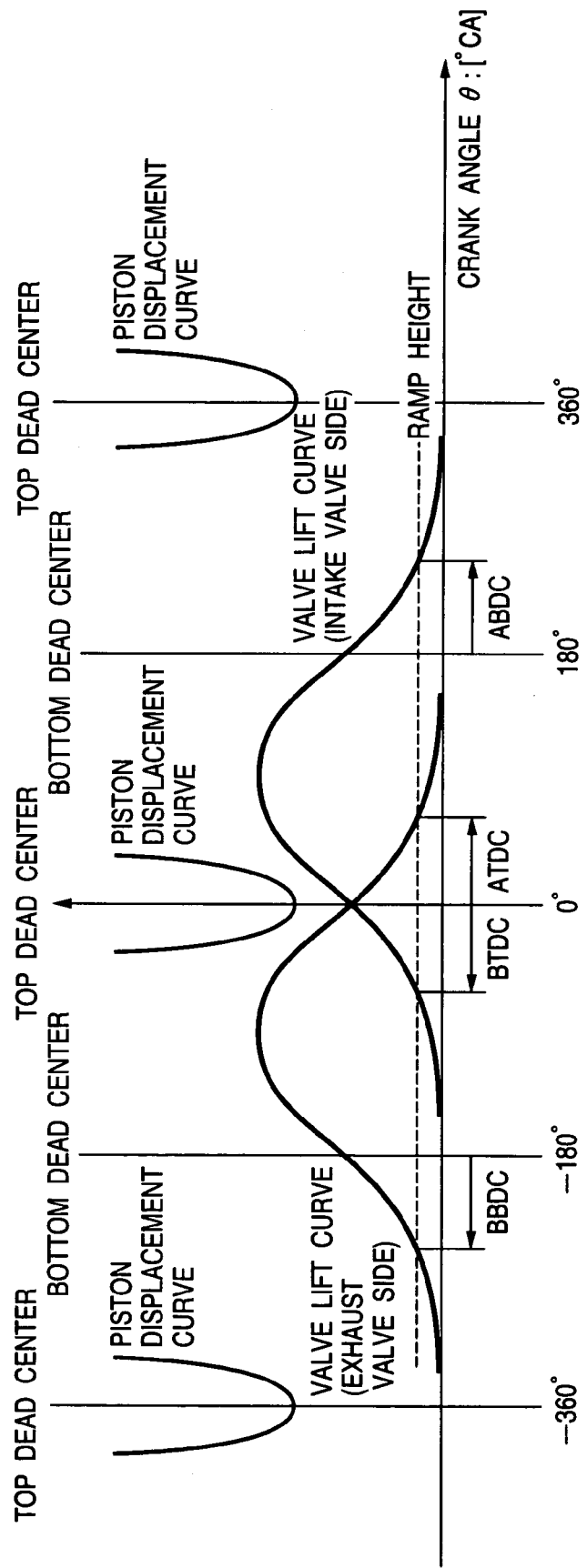
FIG. 5 is a graph showing the relationship between the piston displacement curve and valve lift curve.

Cam lift data: These fields store data indicating the ways the intake-side cam 1181 and exhaust-side cam 1182 lift the valves. Since the rotational angular velocities of these cams are equal to that of the crank 1150, text data that represent the valve lift amounts of the respective cams in correspondence with crank angles are used. FIG. 5 is a graph of the cam lift data in which the abscissa plots the crank angle, and the ordinate plots the valve lift amount.

Valve Timing: These fields store crank angles that represent the deviations of the open timing of the intake-side valve 1171 and the close timing of the exhaust-side valve 1172 from a timing at which the piston 1130 is located at its top dead center. In FIG. 5, BTDC (Before Top Dead Center) and ATDC (After Top Dead Center) represent these angles. The ramp height is derived from the cam lift data.

Layout conditions: These fields store the layout conditions of surrounding components other than the piston dimensions such as a bore diameter, crank diameter, connecting rod length (from the center of the shaft where the connecting rod and crank are connected to the pin hole center), C/W virtual disk radius, combustion chamber capacity, valve center height, intake valve angle, exhaust valve angle, and the like. Note that the bore diameter indicates the inner diameter of the cylinder 1110a. As the combustion chamber capacity, a space volume on the cylinder head 1120 side and a space volume defined by the gasket thickness are input regardless of the piston shape. The valve center height means a distance from the top surface of the gasket 1190 to the valve center. The valve center indicates an intersection between the reciprocating axes of the intake and exhaust valves 1171 and 1172. The intake valve angle and exhaust valve angle represent angles the reciprocating directions of the intake and exhaust valves 1171 and 1172 make with that of the piston 1130. As the layout conditions, a gasket thickness, block height (the distance from the crank shaft to the top surface of the block), valve offset (the distance from the valve center to the central axis of the cylinder), pin offset (the distance from the central axis of the pin to that of the piston), vertical distance from the pin hole center to the skirt lower end, and the like can be input in addition to the above values.

Piston specification values: these fields store a piston diameter, intake- and exhaust-side recess centers (distances from the piston center to the recess centers), intake- and exhaust-side recess depths, crown thickness, various dimensions indicating the skirt outer shape including the skirt outer diameter, various dimensions indicating the skirt inner shape including the skirt inner diameter, various dimensions indicating the pin hole shape, depths, widths, and positions of the ring grooves, distance from the valve center to the piston pin center, compression height (the distance from the pin hole center to the crown top surface), and the like.

Valve specification values: these fields store dimensions indicating the valve shape such as an intake valve diameter, exhaust valve diameter, and the like.

Figure 4B:
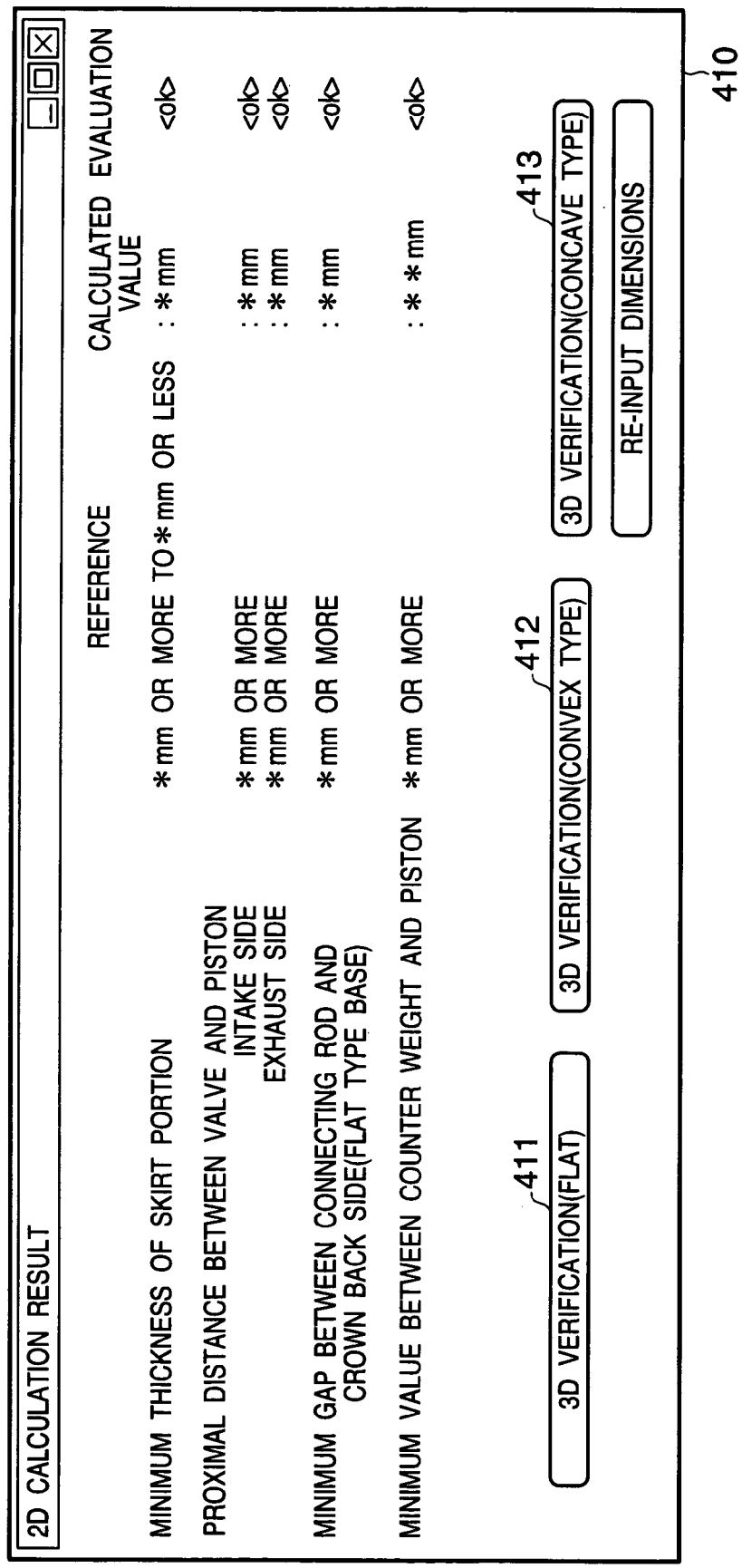

The description will revert to FIG. 3. In step S302, 2D verification is made using the input basic specification values. Note that the 2D verification is verification based on numerical calculations before building of a 3D piston model. This verification is made by substituting the basic specification values in the verification formulas 231 stored in the database server 102. After that, the verification results are displayed in step S303. FIG. 4B shows a verification result display window 410 that shows the verification results. This window shows the verification results: whether or not the thickness of the skirt portion is equal to or larger than the minimum thickness reference, whether or not the distances between the intake and exhaust valves and the piston when they are closest to each other are equal to or larger than a reference value, whether or not the gap between the connecting rod and crown back surface is equal to or larger than a reference value, whether or not the proximal distance between the counter weight and piston is equal to or larger than a reference value. That is, when the corresponding reference value is met, "OK" is displayed; otherwise, "NG" is displayed.

Examples of the verification formulas 231 will be explained. The thickness of the skirt portion is derived by subtracting the skirt inner diameter from the skirt outer diameter reference size and dividing the difference by 2. The gap between the connecting rod and crown back surface is derived by subtracting the crown thickness from the compression height, and subtracting the small end radius (the radius of the end portion that receives the piston) of the connecting rod from the difference. The gap between the counter weight and piston is derived by calculating the second root of a difference obtained by subtracting a square of the pin offset from that of the connecting rod length, and subtracting the distance from the pin hole center to the skirt lower end, crank radius, and C/W virtual disk radius from that second root.

Other items that can be verified by the 2D verification include whether or not the input value of each recess depth is smaller than an allowable maximum depth derived from the specification values associated with the valves and piston, whether or not the thickness between the pin hole and oil land groove meets a reference value, whether or not the surface pressure, various stresses, and flexure amount of the pin hole are equal to or smaller than reference values, and so forth. Note that the allowable maximum depth of each recess is derived from a calculation using specification values such as the target clearance reference, cam lift data, valve timing, crank radius, connecting rod length, pin offset, valve height, block height, gasket thickness, and the like. The allowable maximum depth of each recess varies depending on the cam angles (crank angles). In this case, values are calculated for a case wherein the piston is located at its top dead center (cam angle=0°), are further calculated for all cam angles of the cam lift data, and a minimum value is selected.

Note that the 2D verification may be made by a method other than substitution of the specification values into the verification formulas 231. That is, the 2D shape models 232 of the piston, valves, connecting rod, and counter weight, which can be deformed according to predetermined rules, are prepared in the database server 102. These 2D shape models 232 are read out from the database server 102 and are deformed in correspondence with the basic specification values to verify various gaps on a 2D space. Also, the verification result display is not limited to text display shown in FIG. 4B. For example, the piston, valves, connecting rod, and counter weight may be two-dimensionally displayed to indicate interference and thickness errors.

If all the displayed verification results are OK, the flow advances from step S304 to step S305; if not all verification results are OK and some specification values have problems, the flow returns to step S301 to change these specification values.

In step S305, detailed specification values are input. That is, the piston design support program generates an input window of detailed specification values associated with the piston shape by the specification value input module 115*a*, and displays it on the display 117. In this case, if a file name of the specification value data 122 is designated, the specification value data 122 are read out from the database server 102, and are set as detailed specification values. If no file name is designated, the program prompts the user to input detailed specification values one by one.

As the detailed specification values to be input, the following values can be input.

Target compression ratio: A target value of the compression ratio is input. Note that the compression ratio is the ratio of the maximum and minimum combustion chamber volumes.

Search range of automatic optimization: The upper and lower limit values of the crown depth/height are input.

Detailed dimensions around rings and lands: These dimensions include the outer diameter of the top land, and the outer diameters of the bottom surfaces of the grooves of the top ring, second ring, and oil ring, and also the widths of the top land, top ring, second land, second ring, third land, and oil ring. Furthermore, chamfers and curvatures around rings and lands are included.

In this embodiment, the basic specification values are input in step S301, and the detailed specification values are input in step S305. Alternatively, all specification values (basic and detailed specification values) may be input in step S301.

The flow advances to step S306, and a crown type indicating if the surface of the piston on the combustion chamber side has a flat, convex, or concave shape is selected as one of the specification value.

The verification result display window shown in FIG. 4B displays three select buttons, i.e., a "3D verification (flat)" button 411, "3D verification (convex type)" button 412, and "3D verification (concave type)" button 413. If the detailed specification values have already been input in step S301, these 3D verification buttons 411 to 413 are selectable. When the user selects one of these buttons, the crown type is selected.

For example, when an appropriate crown type required to achieve the target compression ratio is unknown, a flat type 3D piston model is built first, and the compression ratio is measured using that piston model. If the measured compression ratio is lower than the target compression ratio, it is determined that the combustion chamber capacity is short. Hence, the concave type can be selected again to increase the combustion chamber capacity upon measuring the compression ratio. On the other hand, if the measured compression ratio is higher than the target compression ratio, it is determined that the combustion chamber capacity is excessive. Hence, the convex type can be selected again to increase the combustion chamber capacity upon measuring the compression ratio. Furthermore, if the measured compression ratio is equal to the target compression ratio or their difference is negligibly small, the crown type need not be selected again, and the control can enter a CAE analysis process.

In step S307, a piston base model which can be deformed according to predetermined rules is read out from the database. More specifically, intake- and exhaust-side piston models corresponding to the crown type input as the specification value, the skirt inner space model 213, skirt outer space model 214, and pin hole model 215 are read out from the database.

In step S308, the piston generation models read out in step S307 are respectively deformed on the basis of the specification values input in steps S301 and S305. Furthermore, the deformed models are combined to build a piston model in step S309.

Figure 6:
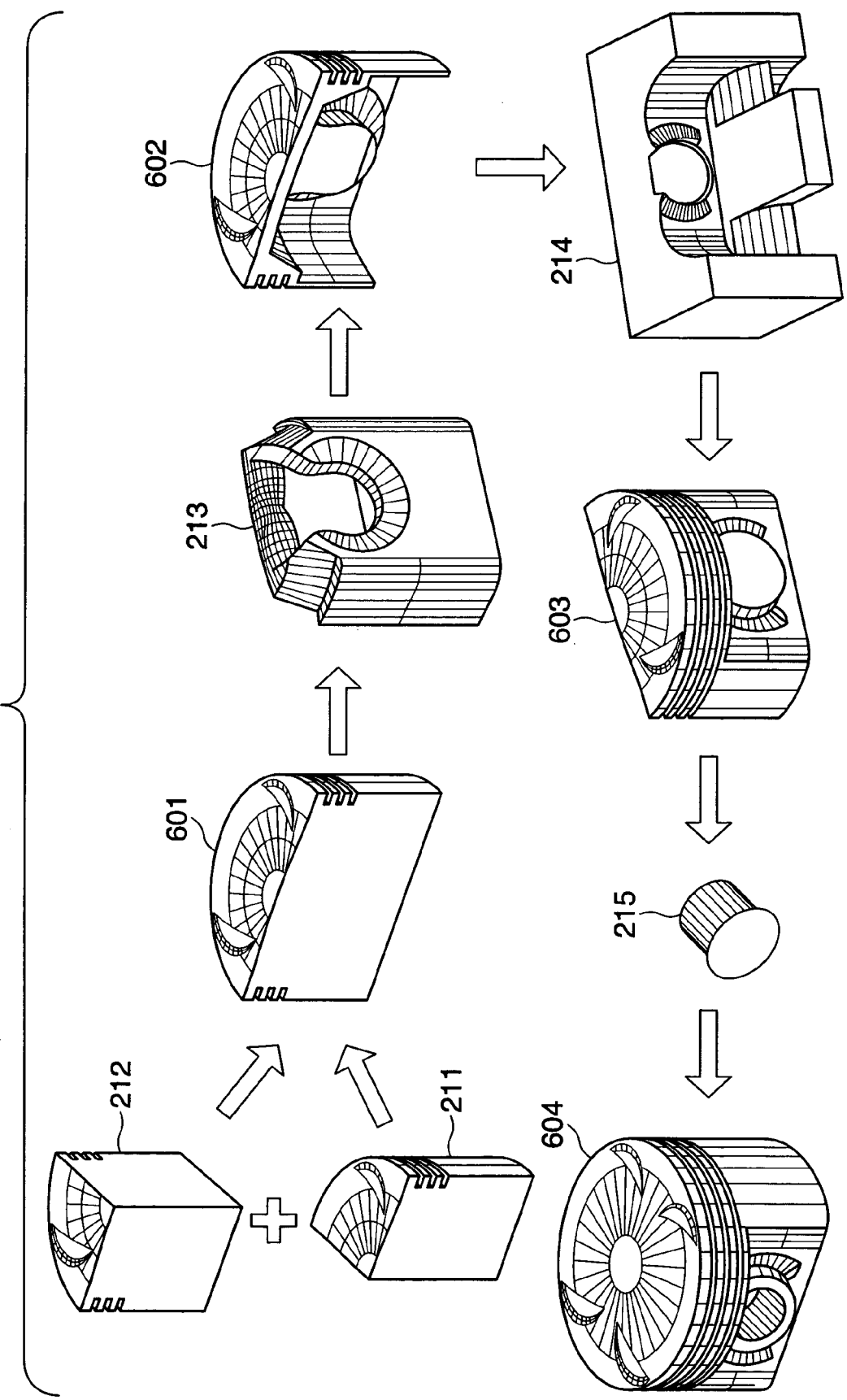
FIG. 6 shows transition of piston models built by the piston design support system according to the first embodiment of the present invention.

FIG. 6 is a view for explaining a piston model building method.

Initially, the intake- and exhaust-side models 211 and 212 which have been deformed according to the specification values are combined to generate a ½ main body model 601. Since the intake- and exhaust-side models 211 and 212 stored in the database server 102 have shapes obtained by cutting the piston into ¼ in the reciprocating axis direction, as described above, the ½ main body model 601 having a shape obtained by cutting the cylindrical piston into ½ is generated by combining these models.

Next, the inner space model 213 deformed according to the specification values is shaved from the ½ main body model. Since the inner space model 213 also has a ½ shape, as described above, a shape 602 is obtained by shaving the inner space model 213 from the ½ main body model. Furthermore, the outer space model 214 is shaved from the shape 602. As a result, a ½ piston model (without a pin hole) 603 is generated. By shaving the pin hole model 215 from this ½ piston model (without a pin hole), a ½ piston model is generated. By mirroring the ½ piston model about the cross section, a full piston model 604 is built.

The inner and outer space models 213 and 214 may be laid out at positions separated from the main body model by distances according to the thicknesses input as the specification values, and the skirt inner space model may be shaved from the main body model, or the inner space model 213 may be deformed so that the skirt inner diameter input as the specification value becomes equal to the outer diameter of the inner space model 213. Note that the inner and outer space models 213 and 214 are synchronously deformed so as to prevent their pin hole positions from being misaligned.

Figure 7A:
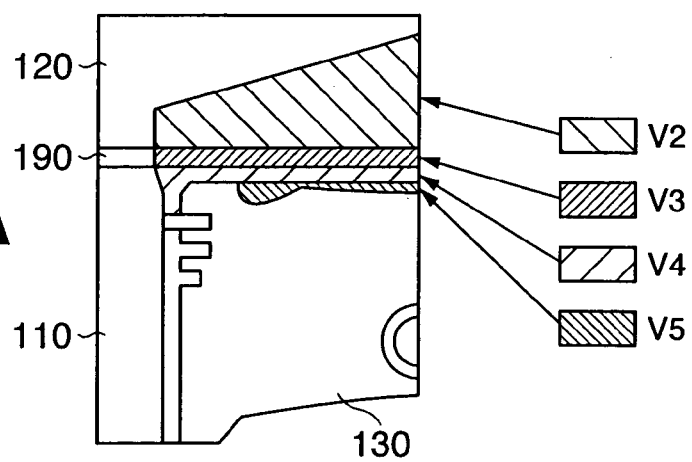
FIG. 7A shows the configuration of a combustion chamber.

The description will revert to FIG. 3. In step S310, 3D verification is made using the piston model built in step S309. The 3D verification verifies the piston dimensions and piston performance on the 3D space, and calculates the thicknesses, gaps, and volumes, which cannot be calculated in the 2D verification. For example, when the 3D piston model is built, and the compression ratio calculation module 115*g* is used, accurate combustion chamber volumes can be calculated, and the compression ratio can be calculated from the volumes. More specifically, volumes V4 and V5 are measured using the 3D piston model. FIG. 7A is a partial sectional view showing a space surrounded by the piston 1130, cylinder block 1110, gasket 1190, and cylinder head 1120 at a timing at which the piston is located at its top dead center. Volumes V2 and V3 are input in advance as the detailed specification values. Let V1 be the displacement per cylinder. Then, V1 is given by:

$$V1 = (\text{bore diameter}/2)^2 \times \pi \times (\text{crown diameter} \times 2)$$

Furthermore, the compression ratio can be calculated by substituting values V1 to V5 in:

$$\text{Compression ratio} = V1/(V2+V3+V4+V5)+1$$

By comparing this compression ratio with the target compression ratio input as the detailed specification value, whether or not an engine using this piston can attain required performance is determined.

Figure 7B:
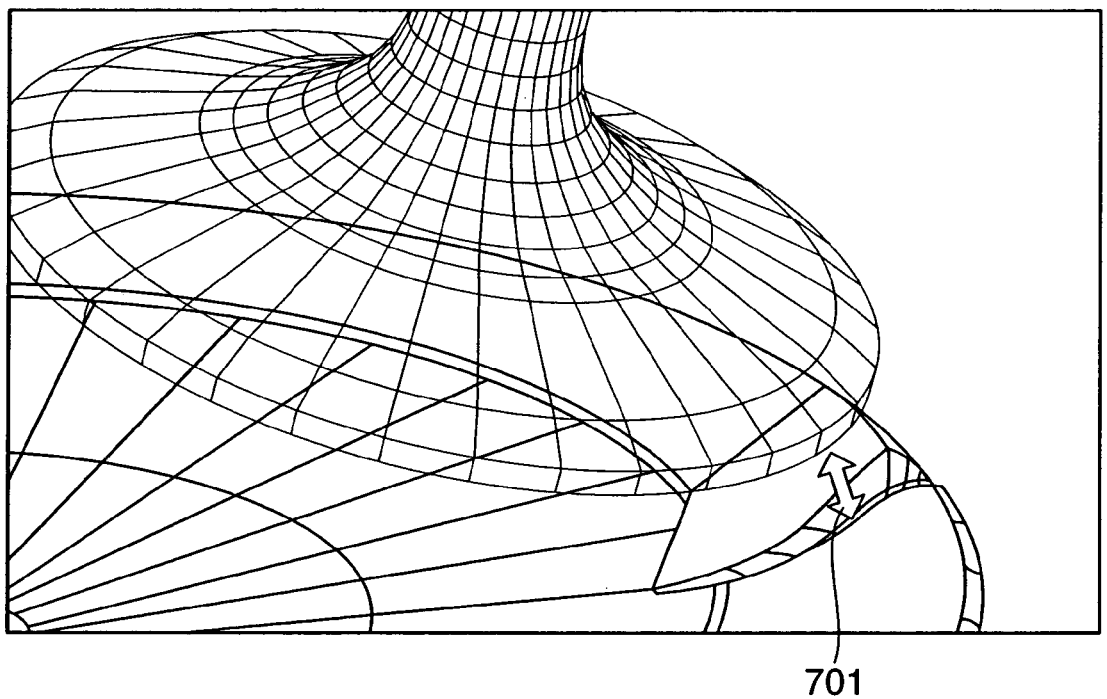
FIG. 7B shows the shortest distance between a valve and piston.

The 3D valve model 241 is read out from the database server 102, and is deformed and laid out in accordance with various specification values. Then, an accurate shortest distance 701 between the valve and piston on the 3D space is calculated, as shown in FIG. 7B, using a distance command of CAD, and whether or not that gap is equal to or larger than a predetermined reference value can be verified. Likewise, the shortest distance between the crown and recess surfaces and the inner surface of the top ring groove, and the shortest distances between the crown and recess surface and the crown back surface are calculated by the gap/thickness calculation module 115e, and whether or not they meet reference values can be verified. Upon building the 3D piston model, the crown height or depth from the piston top surface is determined. Hence, the gap between the crown back surface and connecting rod can be accurately calculated in correspondence with the crown types using:

In case of flat: gap=compression height−crown thickness−connecting rod small end diameter/2

Figure 7C:
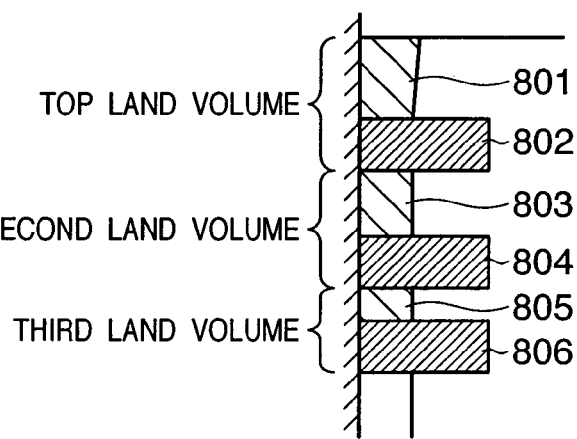
FIG. 7C shows the configuration of land volumes.

In case of convex type: gap=compression height−crown thickness−connecting rod small end diameter/2+crown depth In case of concave type: gap=compression height−crown thickness−connecting rod small end diameter/2−crown depth Furthermore, the volume model 242 is read out from the database server 102, and is deformed on the basis of the piston outer diameter, cylinder inner diameter, and the detailed dimensions around rings and lands (the widths and depths of the piston fitting grooves). Then, the volumes of spaces 801 to 806 between the outer circumferential surface of the piston and the inner circumferential surface of the cylinder in FIG. 7C can be easily calculated using the volume calculation module 115f. Note that the volume of a space as a combination of the spaces 801 and 802 is called a top land volume, that of a space as a combination of the spaces 803 and 804 is called a second land volume, and that of a space as a combination of the spaces 805 and 806 is called a third land volume.

From these volumes, oil consumption and emission performance can be derived. The pressure difference between the combustion chamber 1200 and crank case 1300 depends on the positions of the top ring, second ring, and oil ring, and the capacity ratio of the six spaces partitioned in the volume model 242 is important to improve shielding so as to prevent non-combusted gas from entering the crank case.

Figure 8:
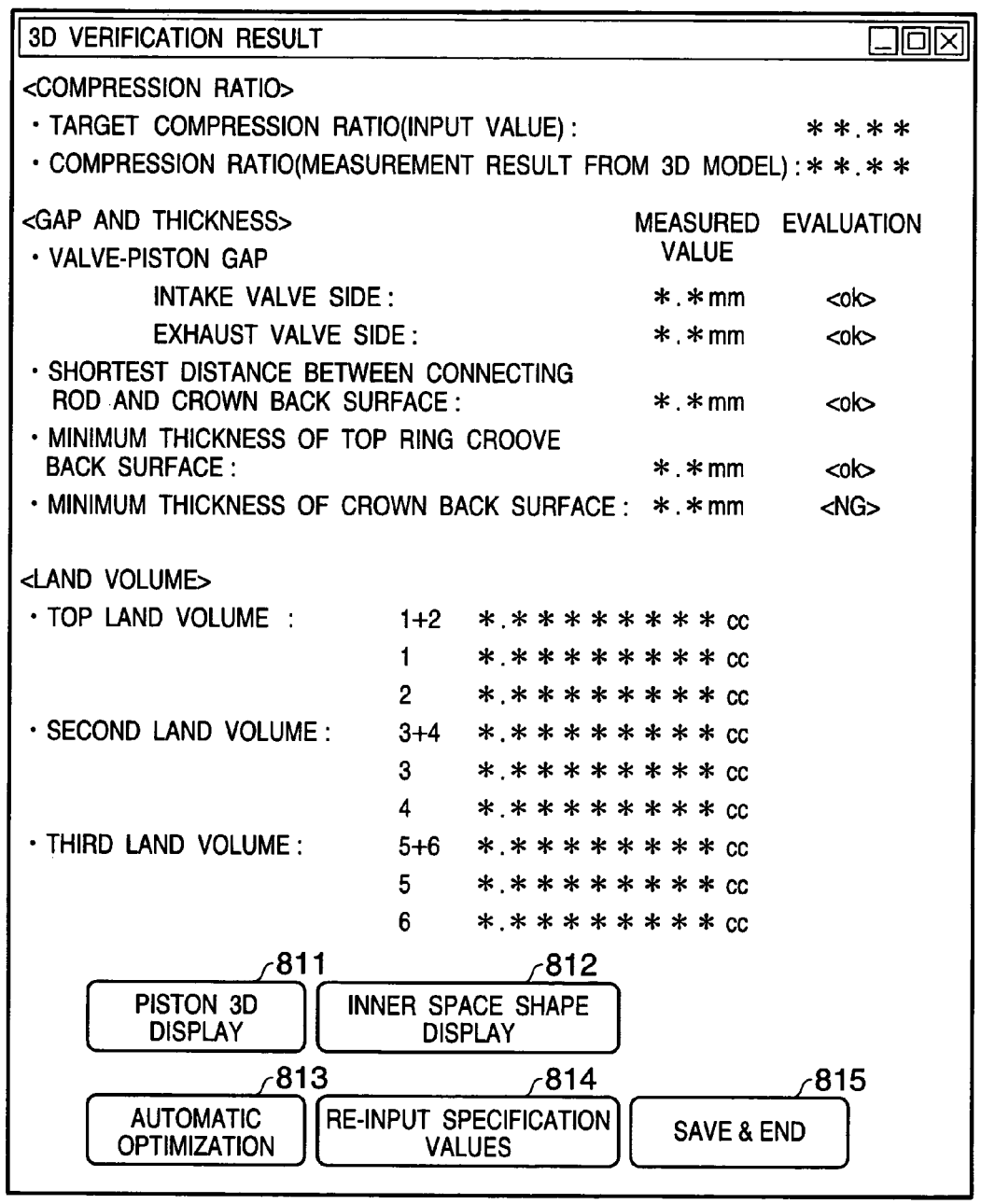
FIG. 8 shows a window displayed by the piston design support system according to the first embodiment of the present invention.

The description will revert to FIG. 3 again. The 3D verification results in step S310 are displayed in step S311. FIG. 8 shows an example of a 3D verification result display window. As shown in FIG. 8, measured values derived by the 3D verification are displayed in association with the compression ratio, gap and thickness, and land volume. Volumes indicated by 1 to 6 in <land volume> respectively correspond to those of the spaces 801 to 806 in FIG. 7C.

The window shown in FIG. 8 displays a piston 3D display button 811, inner space 3D display button 812, automatic optimization button 813, specification value re-input button 814, and save & end button 815. When each of these buttons is selected, the following processes are executed.

Upon selection of the piston 3D display button 811 or inner space 3D display button, the flow advances from step S312 to step S313, and the built piston model 604 or the deformed inner space model 213 is displayed on the display 117. Note that the piston model 604 is displayed while hiding the connected surfaces of the piston generation models.

Upon selection of the automatic optimization button 813, the flow advances from step S312 to step S315 via step S314, and the piston shape is automatically optimized to be approximate to the target compression ratio. More specifically, the target compression ratio input as the specification value, and the measured compression ratio are compared, and the crown height or depth of the piston is changed in correspondence with their difference. The piston model is deformed in accordance with the changed crown height or depth, and the compression ratio of the deformed piston model is calculated. If the difference between the calculated compression ratio and the target compression ratio falls outside a predetermined value range (e.g., ±0.01), the deformation and compression ratio calculation are repeated until the difference between the calculated compression ratio and the target compression ratio falls within that predetermined value range. When the difference between the calculated compression ratio and the target compression ratio falls within the predetermined value range, the deformed piston shape is determined as most approximate to the target compression ratio.

Upon selection of the specification value re-input button 814, the flow returns from step S312 to step S301 or S305 via steps S314 and S315, and the specification value input window is displayed again.

Upon selection of the save & end button 815, it is determined that the verification result is OK, and the flow advances from step S314 to step S316. In step S316, the piston model and all specification values are saved, thus ending the piston design support program.

(Model Deformation Rule)

Model deformation rules in step S308 will be described in detail below. In step S308, the intake- and exhaust-side models 211 and 212 are respectively deformed. However, the specification values need not be independently input for these models, and even when the dimensions of the entire piston are input as the specification values, both the intake- and exhaust-side models 211 and 212 are deformed in correspondence with each other. For example, the outer diameters of the arc portions of the intake- and exhaust-side models 211 and 212 read out from the database server 102 are enlarged or reduced on the same scale with respect to the cylinder diameter input as the specification value.

Upon deforming the intake- and exhaust-side models 211 and 212, the sectional shapes of the intake- and exhaust-side recesses 1130b and 1130c are independently determined. For example, a recess shape determination rule is set so as to deform the intake- and exhaust-side recesses to different shapes even when an identical value is input as the recess depths. This is because an intake recess is required to provide an effect of improving intake convection, but an exhaust recess is not required to provide such effect.

Figure 9A:
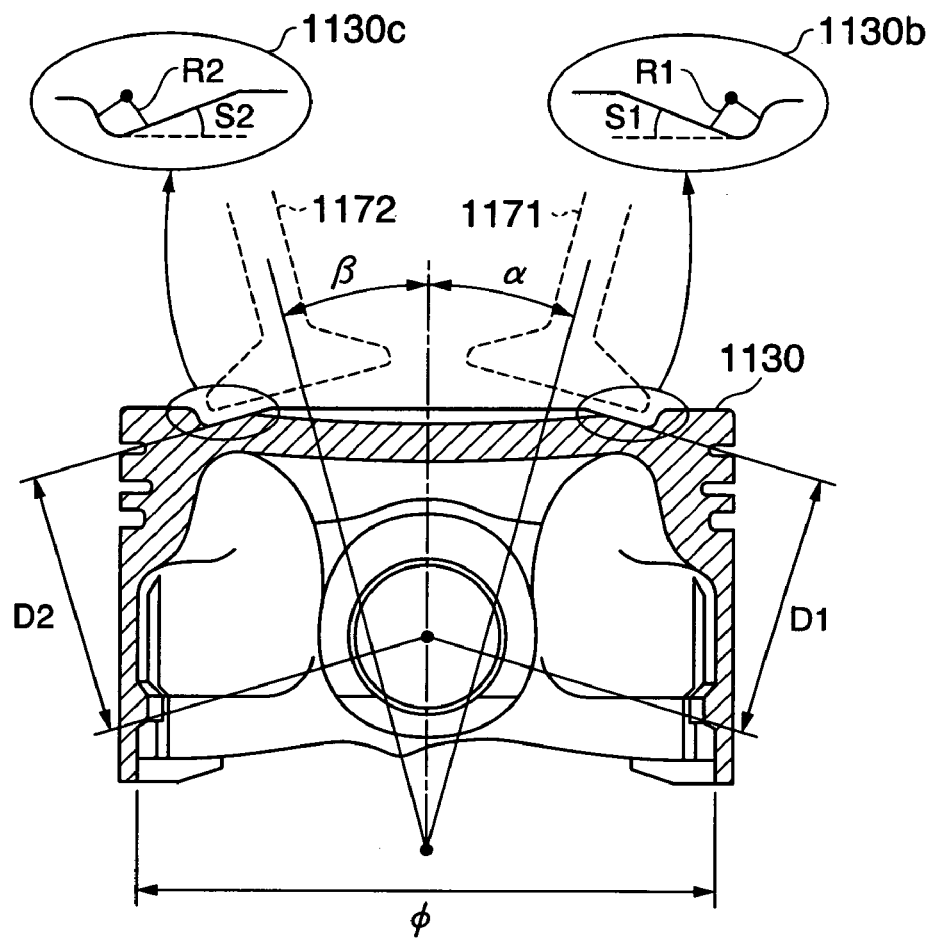
FIGS. 9A and 9B are views for explaining deformation rules of piston generation models by the piston design support system according to the first embodiment of the present invention.

This recess shape determination rule will be described below using FIG. 9A. FIG. 9A is a longitudinal sectional view of the piston 1130 viewed from the pin axis direction. In FIG. 9A, D1 is the depth of the intake-side recess, R1 is the curvature (the radius of curvature of a corner formed by the bottom and side surfaces) of the bottom portion of the intake-side recess, S1 is the slope (the angle the bottom surface makes with the horizontal plane), and a is the nip angle of the intake-side recess. Likewise, D2 is the depth of the exhaust-side recess, R2 is the curvature of the bottom portion of the exhaust-side recess, S2 is the slope of the bottom surface of the exhaust-side recess, and β is the nip angle of the exhaust-side recess. Furthermore, φ is the inner diameter of the skirt.

According to the recess shape determination rule, even when the intake-side recess depth D1 and the exhaust-side recess depth D2 input as the specification values have identical values, the recess shapes are determined so that the slope S1 of the bottom surface of the intake-side recess is different from the slope S2 of the bottom surface of the exhaust-side recess, and the curvature R1 of the corner formed by the bottom and side surfaces of the intake-side recess is different from the curvature R2 of the corner formed by the bottom and side surfaces of the exhaust-side recess. In order to improve intake convection, the bottom surface of the intake-side recess 1130*b* is deformed so that the bottom surface is approximate to horizontal, and the bottom surface has a larger curvature R1. On the other hand, the slope angle S2 of the bottom surface of the exhaust-side recess 1130*c* can be equal to the nip angle β of the exhaust valve (as a result, the bottom surface of the exhaust-side recess 1130*c* is parallel to the valve head surface), and the curvature R2 of the bottom surface can have a predetermined value.

The curvature R2 of the bottom surface of the exhaust-side recess is basically set in correspondence with the exhaust valve shape. The curvature of the intake-side recess is increased to improve convection, but since the exhaust-side recess has no relation to convection, its shape is determined depending on the exhaust valve shape.

When the intake-side recess depth D1 and the exhaust-side recess depth D2 input as the specification values have been changed, at least one of the slope S1 of the bottom surface and the curvature R1 of the corner formed by the bottom and side surfaces of the intake-side recess 1130*b* changes. However, neither the slope S2 of the bottom surface nor the curvature R2 of the corner formed by the bottom and side surfaces of the exhaust-side recess 1130*c* change in such case.

Figure 9B:
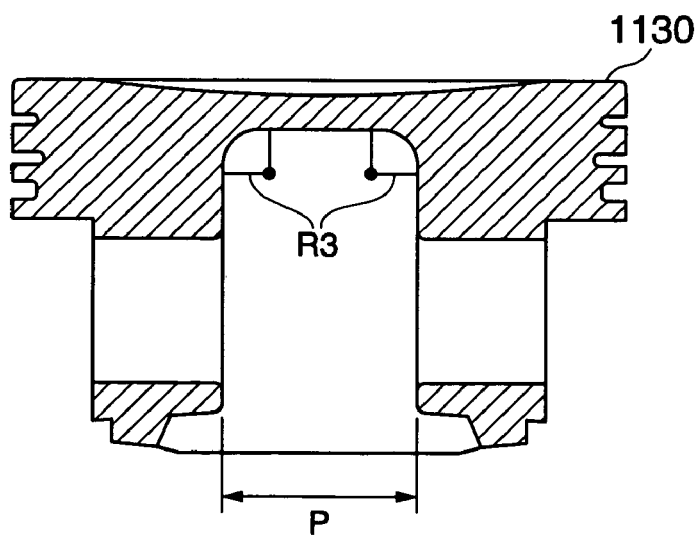

In step S308, the inner space model 213 is deformed in accordance with the specification values. In this case, deformation is made according to an inner space shape determination rule. The inner space shape determination rule will be described below using FIG. 9B. FIG. 9B is a longitudinal sectional view of the piston 1130 viewed from a direction perpendicular to the pin axis. In FIG. 9B, R3 is the curvature (radius of curvature of the corner formed by the back surface of the crown and skirt inner surface) of the crown back surface on the inner space, and P is the pin boss gap.

According to the inner space shape determination rule, the curvature R3 of the crown back surface of the skirt inner space model is increased with increasing target compression ratio input as the specification value. Also, the curvature R3 of the crown back surface of the skirt inner space model is increased with decreasing pin boss gap P input as the specification value. Furthermore, the curvature R3 of the crown back surface of the skirt inner space model is increased with decreasing skirt inner diameter φ input as the specification value.

This rule arises from the fact that the curvature R3 of the crown back surface is a parameter that strongly influences cooling performance (radiation performance). That is, the crown back surface is closest to the combustion chamber 1200 in the piston 1130, and radiation performance can be improved when engine oil injected into the crank case 1300 efficiently deprives the crown back surface of heat. In order to allow engine oil to efficiently deprive the crown back surface of heat, the curvature R3 of the crown back surface can be increased. When the curvature R3 of the crown back surface is increased, heat produced on the crown back surface can be let out to the skirt portion via the chamfer of the crown back surface. However, since an increase in curvature R3 of the crown back surface leads to an increase in weight, it is not preferable to needlessly increase R3.

Hence, as described above, when the target compression ratio is large and the heat quantity to be produced increases, or when the pin boss gap P or skirt inner diameter φ is small, and the total radiation area decreases, the curvature R3 is increased to improve the radiation performance on the crown back surface. By applying this rule, an optimal curvature R3 of the crown back surface can be determined in consideration of the balance between the radiation performance and weight.

(Effect of First Embodiment)

According to this embodiment, a piston which can meet predetermined constraint conditions can be easily designed. Since piston generation models with efficient shapes are stored in the database, the processing load and data size can be reduced. Also, automatic optimization of piston design is achieved. Everyone can easily design a piston which meets the target compression ratio. Even when the user changes the target compression ratio variously, a piston that realizes the target compression ratio can be designed in a short period of time.

Whether or not the gaps between the piston and valves and the like are appropriate can be quickly and easily confirmed, thus improving the piston design efficiency. That is, after whether or not input specification values are appropriate is verified, a 3D piston model is then read out from the database, and is deformed on the basis of the specification values which are determined to be appropriate. Therefore, whether or not the specification values are appropriate can be determined before generation of a 3D piston model, and detection of problems and design changes after generation of the 3D piston model can be reduced.

As the precondition of the present invention, gap check can be made across respective portions of a piston using a 3D piston model including piston shape deformation rules. That is, verification can be made in the flow of specification value input→determination of the entire piston shape by deforming a piston model→reading out of object data which are to undergo gap verification→gap check between the objects which are to undergo gap verification and the piston shape. However, when the verification is made in such flow, if problems are detected in gaps, the specification values must be changed, the 3D piston model must be deformed based on the changed specification values, and the gaps must be verified again, resulting in a very long arithmetic time.

Hence, the present invention can solve the above problem by making simple gap check before the 3D shape of a piston is generated and undergoes gap check on the 3D space. That is, in the present invention, prior to gap check on the 3D space, the gaps between the piston and valves, that between the piston and connecting rod, that between the piston and counter weight, and the like are verified using the verification formulas or 2D data. In such case, the precision is slightly inferior to that of gap check on the 3D space. However, an effect of a given level or higher can be expected, and if problems are found by verification using the verification formulas or 2D data, those problems certainly occur in a 3D model, thus improving the verification efficiency.

For example, verification may be made in the flow of specification value input→determination of a 2D piston shape (2D: takes short time)→reading out of object data (2D) which are to undergo gap verification→gap check between objects which are to undergo gap verification and the piston shape (2D: takes short time)→determination of the entire piston shape by deforming a piston model (3D: takes long time)→reading out of object data (3D) which are to undergo gap verification→gap check between objects which are to undergo gap verification and the piston shape (3D: takes long time). In such flow, if problems are found in 2D gap check, 2D piston shape determination and gap check can be repeated. Hence, the total piston design time can be shortened compared to a case wherein 3D piston shape determination and gap check are repeated.

That is, obvious interference between the piston and the valve, connecting rod, or counter weight can be avoided before generation of a 3D piston model by verifying whether or not the gap between the piston and the valve, connecting rod, or counter weight is equal to or larger than a predetermined value, thus allowing efficient piston design.

Also, the presence/absence of interference can be confirmed more obviously by generating 2D models of the piston and the valve, connecting rod, or counter weight on the basis of the specification values.

Whether or not the specification values are appropriate can be determined using the verification formulas stored in the database, thus facilitating verification before generation of a 3D model.

Furthermore, whether or not the gap is equal to or larger than a predetermined value is determined on the 3D space using the 3D piston model. Hence, the presence/absence of interference between the piston and surrounding components can be determined more accurately.

Since one of the types which are classified depending on the shapes of the combustion chamber surface of the piston is selected, and a piston model corresponding to the selected type is read out from the database and is deformed, the piston type can be selected in accordance with the verification results. Also, piston design can be more efficiently made by deforming type-dependent piston models.

Note that the program according to this embodiment can be applied not only to a vehicle engine but also to design of pistons arranged in every internal combustion engines.

Second Embodiment

Figure 12:
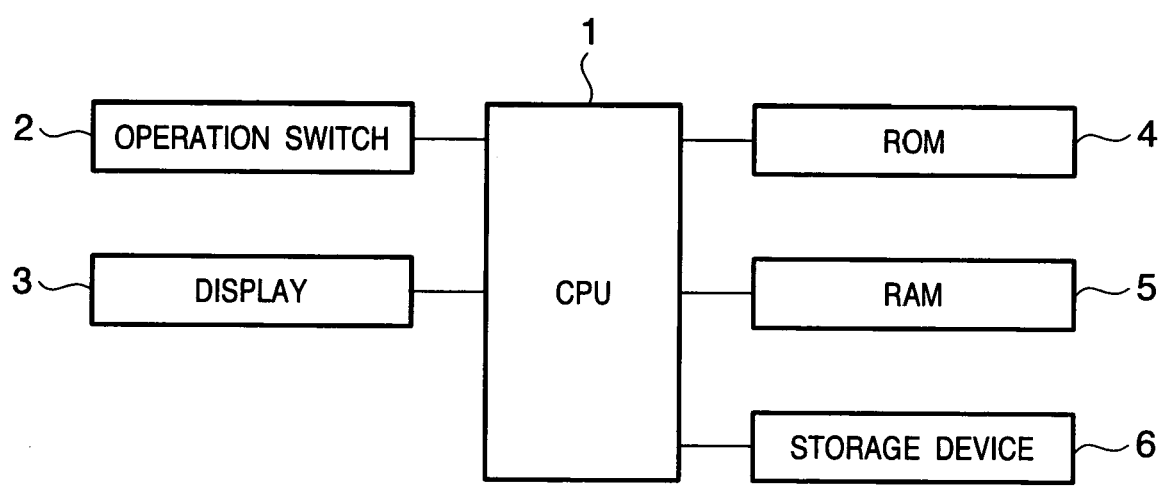
FIG. 12 is a schematic block diagram showing the arrangement of a design support apparatus according to the second embodiment of the present invention.

The second embodiment of the present invention will be described hereinafter with reference to the accompanying drawings. FIG. 12 shows a schematic arrangement of a design support apparatus according to the second embodiment of the present invention. This design support apparatus is a computer apparatus, which comprises a CPU 1 for executing control processes of various signals. To this CPU 1, an operation switch 2 including a keyboard, mouse, and the like, which serve as input means that allows the designer to input various kinds of information, a display 3 such as a liquid crystal display for displaying various windows, a ROM 4 that records a boot program and the like, a RAM 5 that temporarily stores various processing results, and a storage device 6 such as a hard disk drive or the like which records a design support program required to control this design support apparatus are connected so that they can exchange signals.

Figure 13:
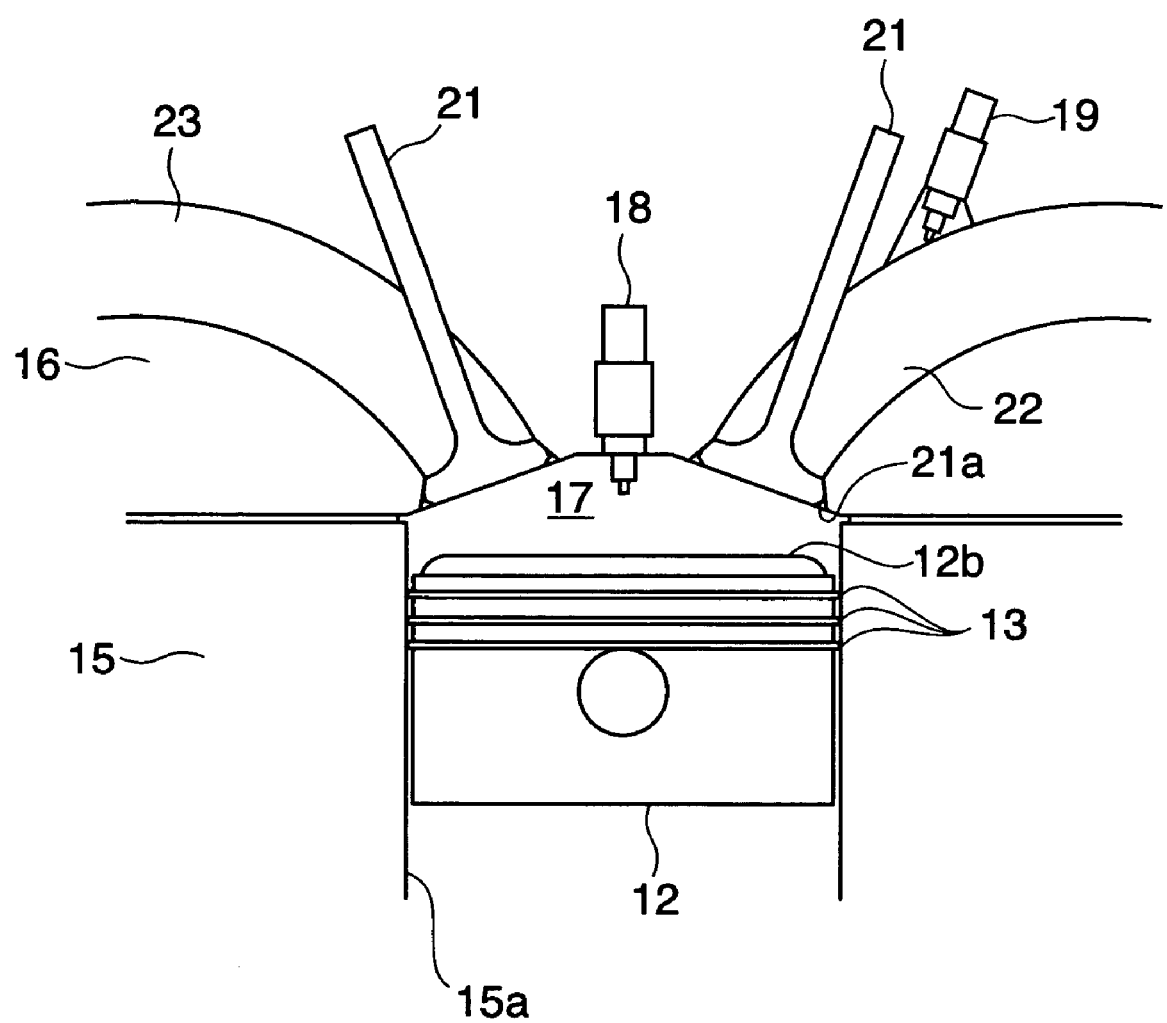
FIG. 13 is a schematic view showing the configuration of an engine comprising a piston which is designed using the design support apparatus according to the second embodiment of the present invention.

The design support apparatus operates, as will be described later, on the basis of the design support program, so as to support design of the shape (mainly a top portion and piston ring groove portions) of a piston 12 in an engine 11 (four-cycle gasoline engine in this embodiment) shown in FIG. 13.

The engine 11 comprises a cylinder block 15 having a cylinder 15a, a cylinder head 16 mounted on the top surface of this cylinder block 15, and a piston 12 which is reciprocally fitted in the cylinder 15a. In the cylinder 15a, a combustion chamber 17 surrounded by the piston 12 and cylinder head 16 is formed. A spark plug 18 is arranged on the upper portion of this combustion chamber 17, and a fuel injection valve 19 is provided to an intake port 22.

The cylinder head 16 has four valves 21 (two intake valves that respectively open/close the openings of two intake ports 22 on the combustion chamber 17 side, and two exhaust valves that respectively open/close the openings of two exhaust ports 23 on the combustion chamber 17 side). All the reciprocating directions (the extending directions of the central axes of the valves 21) of these valves 21 do not agree with the reciprocating direction (the extending direction (vertical direction) of the central axis of the piston) of the piston 12, and make a predetermined angle with the reciprocating direction of the piston 12. The thickness of each valve 21 (the length of a portion that opens/closes the opening of each port along the central axis direction) is set to be equal to or larger than a prescribed value so as to maintain reliability. Furthermore, a corner portion of each valve 21 where the recess opposing surface and side circumferential surface cross is formed with a chamfer 21a on the entire perimeter. Note that the chamfer 21a is not always required, but may not be formed.

Figure 14:
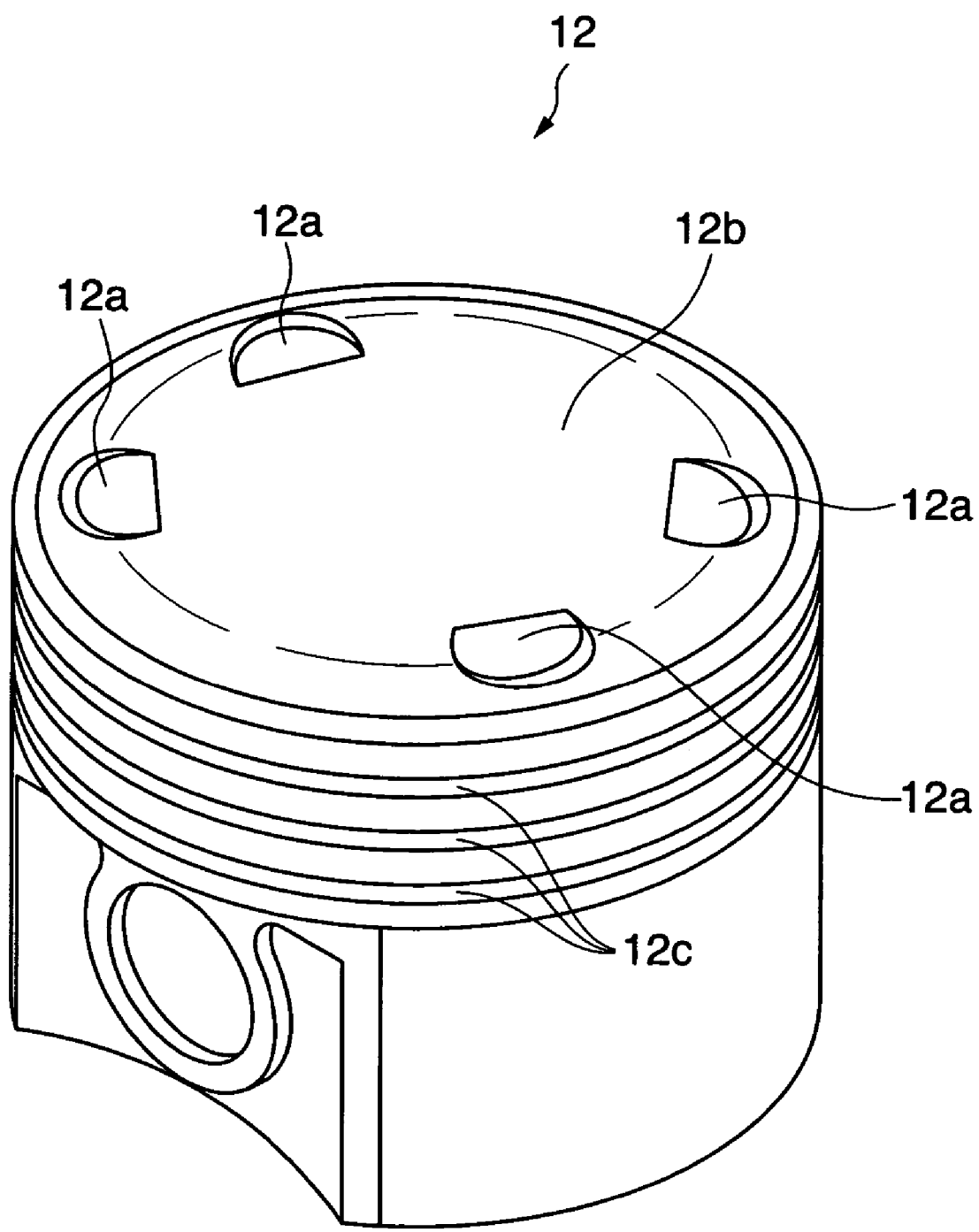
FIG. 14 is a perspective view showing the top surface of the piston shown in FIG. 13.

Four recesses (concave portions) 12a, which respectively oppose the valves 21, are formed on the top portion of the piston 12, as shown in FIG. 14. A gap between each recess 12a and corresponding valve 21 is set to satisfy a predetermined condition. That is, in this embodiment, in order to prevent the valve 21 from interfering with the piston 12 (recess 12a) even with any manufacturing error or the like when the piston 12 and valve 21 come closest to each other, the distance between the recess 12a of the piston 12 and the valve 21 in the valve reciprocating direction is set to be equal to or larger than a first reference value, the distance between the recess 12a and the valve 21 in a direction perpendicular to the valve reciprocating direction is set to be equal to or larger than a second reference value (smaller than the first reference value), and the shortest distance between the recess 12a and valve 21 is set to be equal to or larger than a third reference value (larger than the second reference value but smaller than the first reference value) as predetermined conditions. Since a convex portion 12b (to be described later) is formed around each recess 12a, the open end of the recess 12a has not a flat shape but a shape along the surface of the convex portion 12b.

The outer rim portion of the top portion of the piston 12 forms a flat shape perpendicular to the central axis of the piston 12, and a convex portion 12b which forms a circular shape viewed from the central axis direction of the piston 12 is formed on a portion except for the outer rim portion. The diameter, projecting height, and the like of this convex portion 12b are determined so that a compression ratio assumes a predetermined setting value, i.e., the capacity of the combustion chamber 17 (the capacity when the piston 12 is located at its top dead center) assumes a value determined from the setting value of the compression ratio.

Three piston ring grooves 12c that receive piston rings 13 are formed on the side circumferential surface of the piston 12 near the top portion. The minimum value of a thickness between the uppermost one of these piston ring grooves 12c and the recess 12a is set to be equal to or larger than a predetermined value (a value determined in terms of the mechanical strength, manufacture, and the like of the piston 12).

Upon designing the piston shape which has recesses on its top portion as in the conventional method, the recess shape is normally determined first. At this time, the gap between each recess and the corresponding valve must satisfy a predetermined condition. That is, the valve must be prevented from interfering with the piston (recess) even with any manufacturing error when the piston and valve come closest to each other. After the recess shape is determined, if the compression ratio and the like are initially determined, the shape of the piston top portion is determined so that the capacity of the combustion chamber (that when the piston is located at its top dead center) becomes a target capacity determined from the target compression ratio and the like. More specifically, when the capacity of the combustion chamber is smaller than the target capacity determined from the target compression ratio and the like, a recess portion is formed on the piston top portion to increase the combustion chamber capacity; when it is larger than the target capacity, a convex portion is formed on the piston top portion (except for the recesses) to decrease the combustion chamber capacity.

When the combustion chamber capacity is decreased by forming the convex portion on the piston top portion, that convex portion is often formed around the recesses. In such case, the open end of each recess approaches the valve side due to the presence of the convex portion, and the gap between the recess and valve may not satisfy the predetermined condition.

However, in an engine in which the reciprocating direction of the piston does not agree with that of each valve, if the recess size is minimized, the recess shape is complicated, and it is not easy to quickly and precisely calculate the gap between the recess and valve. On the other hand, when each recess is increased in size to have a simple shape, combustion performance impairs.

When the gap between the recess and valve does not satisfy the predetermined condition, at least one of the valve thickness, and the slope angle of the chamfer of the valve which is formed on the corner portion as an intersection between the recess opposing surface and side circumferential surface is automatically changed so as to satisfy the predetermined condition. As a result, when the gap between the recess and valve does not satisfy the predetermined condition, the designer can easily cope with such case without changing the piston shape.

That is, when the gap between the recess and valve does not satisfy the predetermined condition, if the valve shape is changed to satisfy the predetermined condition, the valve thickness may become smaller than the prescribed value determined in terms of reliability and the like, thus posing a problem. However, in the present invention, when the valve thickness is smaller than the prescribed value, the gap between the recess and valve is changed, and a recess model building step is executed again. Hence, any reliability drop of the valve can be suppressed. An input step prompts the designer to further input information associated with the positions and shapes of piston ring grooves to be formed on the side circumferential surface of the piston, and makes a computer execute a piston building step of building a 3D piston model which comprises recesses and piston ring grooves on the basis of a recess model built in the recess model building step and the information associated with the piston and the information associated with the positions and shapes of the piston ring grooves input in the input step independently of or to include a piston top portion model built in a piston top portion model building step, and a recess thickness arithmetic step of calculating the minimum value of a thickness between each recess and the piston ring groove in the piston model on the basis of the piston model built in the piston building step.

More specifically, in order to minimize HC and CO emissions by decreasing the amounts of engine oil and fuel components in air-fuel mixture, which become attached to the piston or cylinder, and stay on portions between the piston and cylinder on the piston top portion side of piston rings which are fitted into the piston ring grooves, the piston ring grooves must be formed at positions closer to the piston top portion to some extent. However, when the recesses are formed on the piston top portions, the minimum value of the thickness between each recess and the piston ring groove often becomes smaller than a predetermined value (which is determined in terms of the piston mechanical strength, manufacturing, and the like). Hence, the designer must care about the thickness between the recess and piston ring groove, but it is not easy to quickly and precisely calculate the minimum value of the thickness since the recess shape is complicated. However, in the present invention, since the minimum value of the thickness between the recess and piston ring groove is calculated on the basis of the three-dimensionally built piston model, the designer can quickly and precisely obtain the minimum value of the thickness even when the recess shape is complicated. As a result, the designer can design the piston shape more efficiently and optimally.

The input step prompts the designer to further input information associated with at least the shapes of the piston ring grooves to be formed on the side circumferential surface of the piston, and makes the computer execute a piston building step of building a 3D piston model which comprises recesses on the basis of a recess model built in the recess model building step and the information associated with the piston input in the input step independently of or to include a piston top portion model built in the piston top portion model building step, and a groove position arithmetic step of calculating the positions of the piston ring grooves on the basis of the piston model built in the piston building step and the information associated with the shapes of the piston ring grooves input in the input step so that the minimum value of the thickness between each recess in the piston model and the piston ring groove becomes equal to or larger than a predetermined value.

In this way, since the piston ring groove positions are calculated based on the three-dimensionally built piston model so that the minimum value of the thickness with the recess is equal to or larger than the predetermined value, the designer can quickly and precisely obtain the piston ring groove positions.

Figure 15:
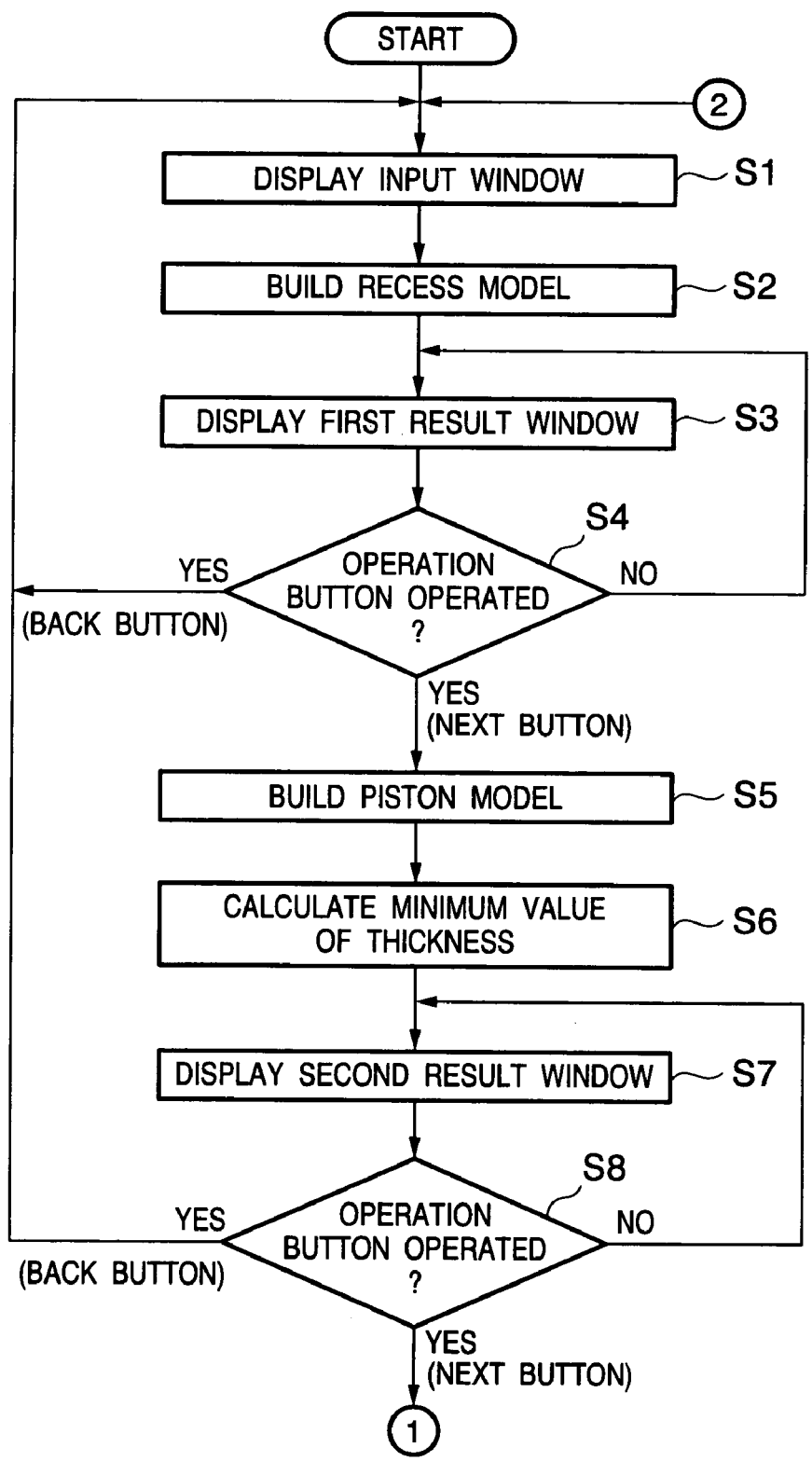
FIG. 15 is a flow chart showing the first half of the process of a CPU in the design support apparatus according to the second embodiment of the present invention.
Figure 16:
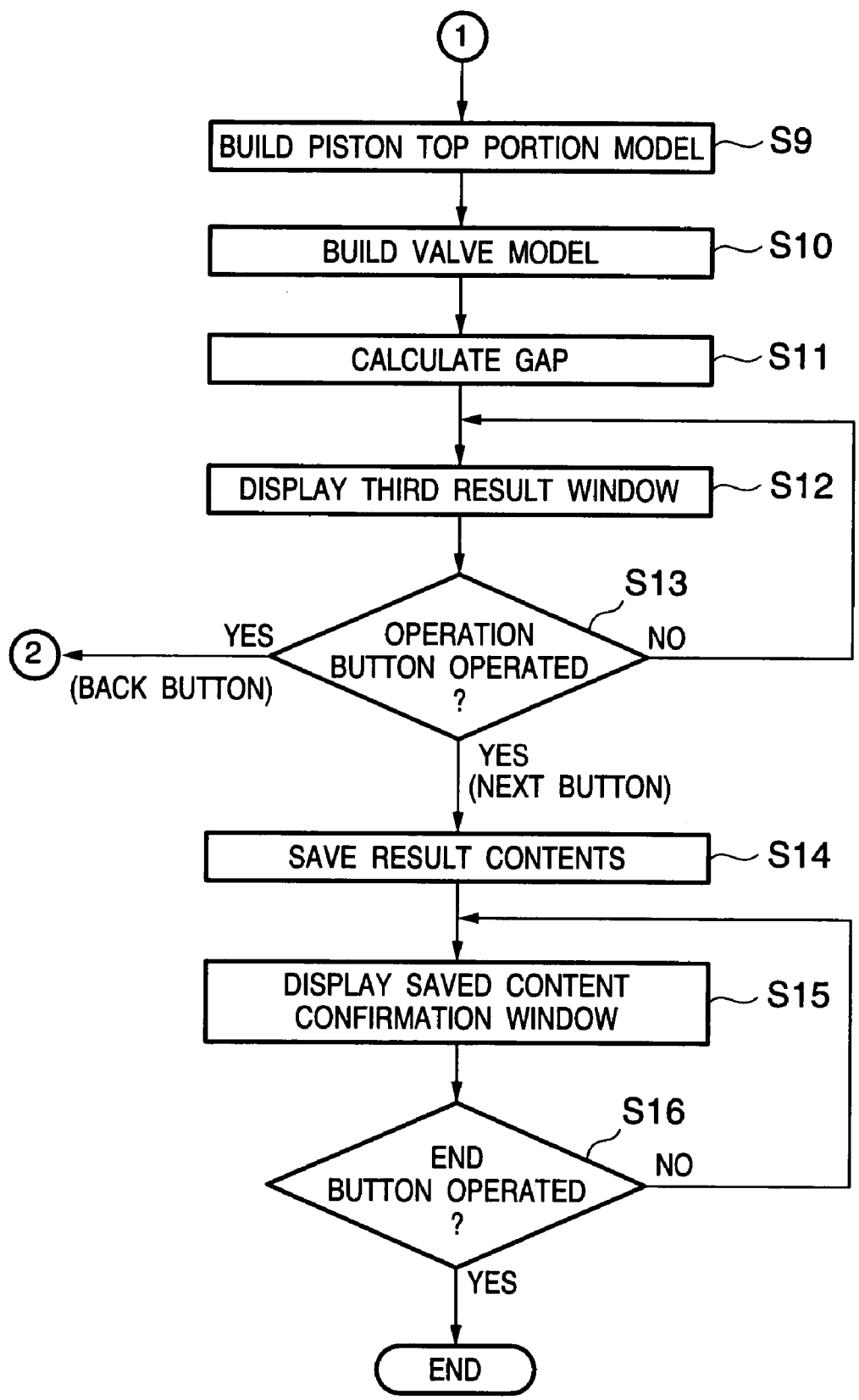
FIG. 16 is a flow chart showing the second half of the process of a CPU in the design support apparatus according to the second embodiment of the present invention.

The detailed process of the CPU 1 in the design support apparatus will be explained below with reference to the flow charts of FIGS. 15 and 16.

In step S1, an input window is displayed on the display 3 in response to a designer's predetermined start operation by operating the operation switch 2, and prompts the designer to input information associated with the piston 12, information associated with the valves 21, information associated with the positions and shapes of the piston ring grooves 12c, information associated with surfaces of the cylinder head 16 that form the combustion chamber 17, and a target compression ratio (the above setting value). Note that the designer may input a target value of a capacity-related value, which can determine the capacity of the combustion chamber 17, in place of the target compression ratio.

More specifically, the information associated with the piston 12 includes data associated with reciprocal motion of the piston 12 (data that can derive the relationship between the crank angles and the top and bottom dead centers of the piston 12, data that can reveal the relationship with a cylinder bore, and the like), data associated with the outer diameter, and the shapes of portions other than the top portion, and the like. Also, the information associated with the valves 21 includes data associated with reciprocal motion of the valves 21 (data that can derive the relationship between the crank angles and valve lift amounts), data associated with the positional relationship with the piston 12 and the shapes, and the like.

In step S2, a recess model which opposes each valve 21 and has a gap with that valve 21 to satisfy the predetermined condition is formed on the top portion of the piston 12 on the basis of the information associated with the piston 12 and that associated with the valves 21 input in step S1 described above (note that the same reference numerals in models denote the same parts corresponding to real components). At this time, in this embodiment, the top portion of the piston 12 is set in advance to have a flat shape perpendicular to the central axis of the piston 12 (no data associated with the top portion shape is input). However, the top portion of the piston 12 may be set in advance to have another shape, or the designer may input data associated with the top portion shape and the top portion of the piston 12 may have a shape according to the input information.

Figure 17:
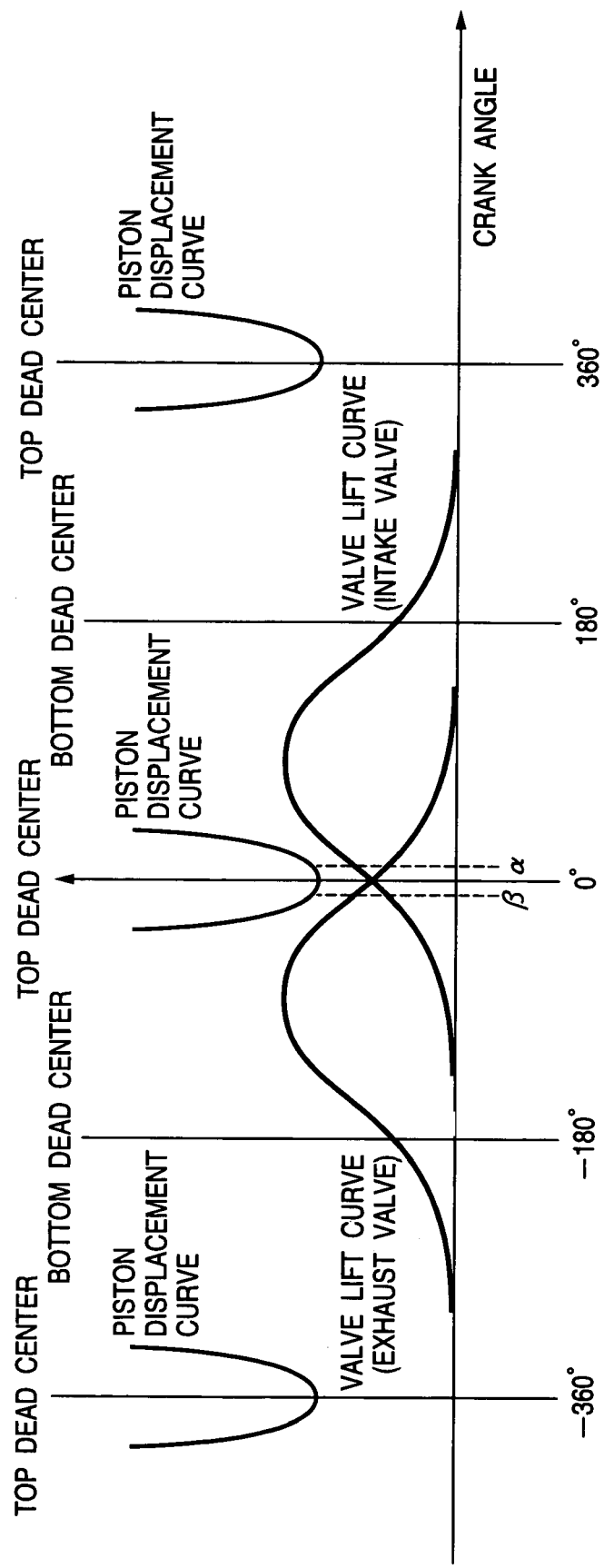
FIG. 17 is a graph showing the relationship between the piston displacement curve and valve lift curve according to the second embodiment of the present invention.
Figure 18:
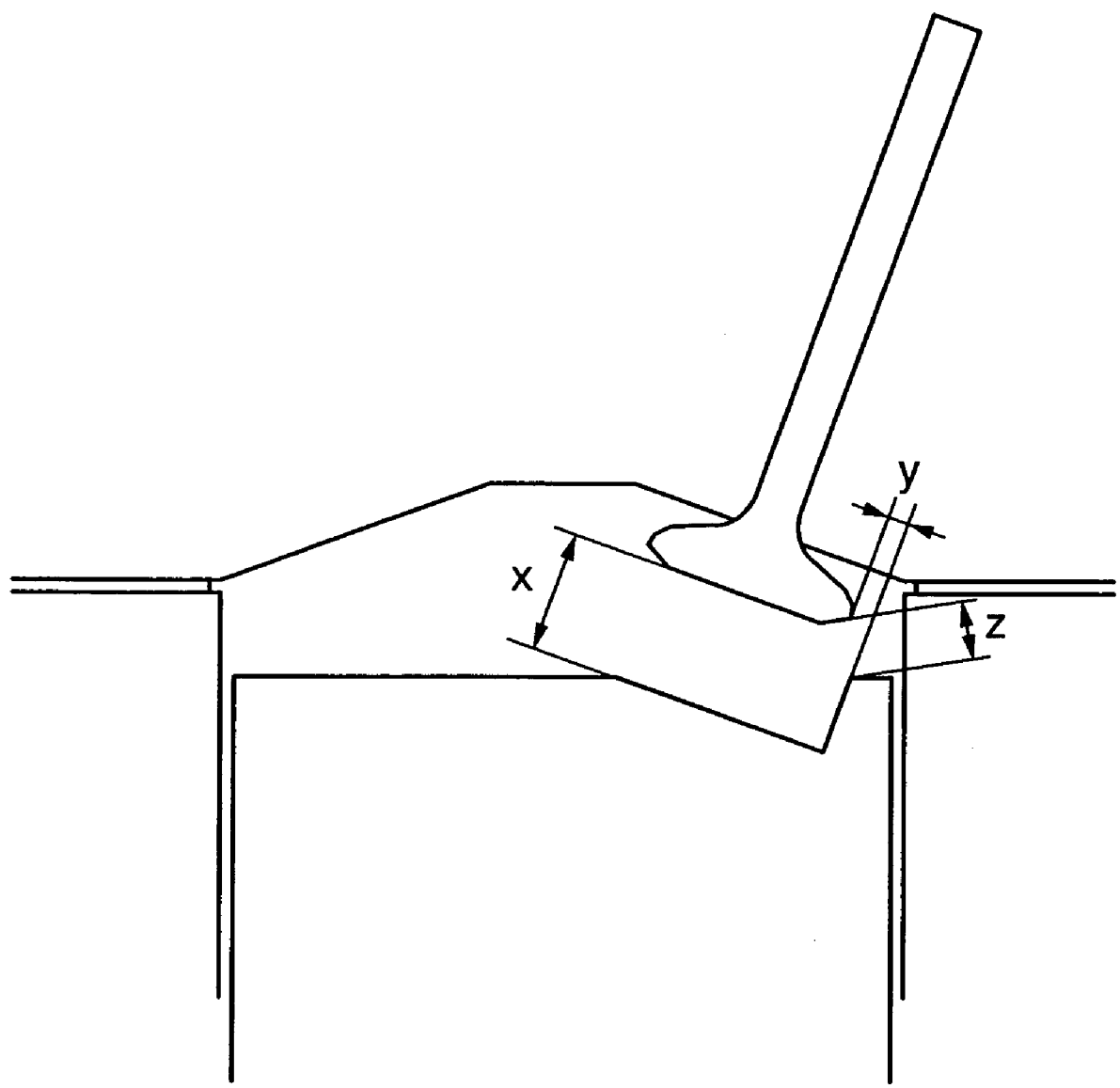
FIG. 18 shows a state wherein a recess model according to the second embodiment of the present invention is built two-dimensionally.

The recess model building method will be described in detail below. The positional relationship between the piston 12 and each valve 21 when they come closest to each other is recognized on the basis of the information associated with the piston 12 and that associated with the valves 21, and a recess model is (two-dimensionally) built at that position on a plane which is parallel to the central axis of the piston 12 and includes that of the valve 21. More specifically, when the relationship (piston displacement curve) between the crank angles and piston top and bottom dead centers, and the relationship (valve lift curve) between the crank angles and valve lift amounts are plotted on a single graph, as shown in FIG. 17, the closest positions of the piston 12 and each valve 21 and a crank angle at that time can be detected from the graph (in FIG. 17, each intake valve comes closest to the piston when the crank angle is $\alpha$, and each exhaust valve comes closest to the piston when the crank angle is $\beta$). Then, the piston 12 and valve 21 at that crank angle are modeled on the plane which is parallel to the central axis of the piston 12 and includes that of the valve 21, and a recess model which has a gap with the valve 21 to satisfy the predetermined condition is built on the top portion of the piston 12, as shown in FIG. 18. That is, a distance x between the recess 12a and the valve 21 in the valve reciprocating direction is set to be equal to or larger than a first reference value, a distance y between the recess 12a and the valve 21 in a direction perpendicular to the valve reciprocating direction is set to be equal to or larger than a second reference value (smaller than the first reference value), and a shortest distance z between the recess 12a and valve 21 is set to be equal to or larger than a third reference value (larger than the second reference value but smaller than the first reference value).

Note that the recess model need not be built two-dimensionally, but may be built three-dimensionally (if the top portion of the piston 12 has a complicated shape in place of a flat shape, the recess model is preferably built three-dimensionally). When a 2D recess model is built, a plane on which that model is to be built is not particularly limited as long as it is parallel to the central axis of the piston 12, but a plane including the central axis of the valve 21 is preferably used, as described above.

In step S3, a first result window that displays the dimensions and the like of each recess 12a of the built recess model is displayed on the display 3. This first result window includes an operation button used to proceed to the next step (to be referred to as a next button hereinafter) and an operation button used to return to the input window (to be referred to as a back button hereinafter).

It is checked in step S4 if the operation button has been operated. If NO in step S4, i.e., neither the next button nor the back button have been operated, the flow returns to step S3 to continuously display the first result window. If YES in step S4, and the next button has been operated, the flow advances to step S5; if YES in step S4, and the back button has been operated, the flow returns to step S1.

In step S5, a piston model which comprises the recesses 12a and piston ring grooves 12c is three-dimensionally built on the basis of the built recess model, and the input information associated with the piston 12 and that associated with the positions and shapes of the piston ring grooves 12c. Each recess 12a in this 3D piston model has a shape which is concaved by pressing a corner portion defined by an end face and side circumferential surface of a cylinder against the top portion of the piston 12 while that cylinder is inclined so that its central axis agrees with the reciprocating direction of the valve 21.

In step S6, a minimum value of the thickness between each recess 12a and the piston ring groove 12c (uppermost one) in the piston model is calculated on the basis of the 3D piston model. In step S7, a second result window that displays the minimum value of the thickness and the like is displayed on the display 3. This second result window includes two operation buttons, i.e., next and back buttons, as in the first result window.

It is checked in step S8 if the operation button has been operated. If NO in step S8, i.e., neither the next button nor the back button have been operated, the flow returns to step S7 to continuously display the second result window. If YES in step S8, and the next button has been operated, the flow advances to step S9; if YES in step S8, and the back button has been operated, the flow returns to step S1.

In step S9, the shape of the top portion of the piston 12 is set on the basis of the recess model, and the input information associated with the piston, information associated with the surfaces which form the combustion chamber 17, and target compression ratio so that the capacity of the combustion chamber 17 becomes a target capacity determined from the target compression ratio, and a piston top portion model is built three-dimensionally. More specifically, when the capacity of the combustion chamber 17 defined by the flat top portion upon building the recess model is smaller than the target capacity determined from the target compression ratio, a concave portion is formed on the top portion of the piston 12 except for the outer rim portion to increase the capacity of the combustion chamber 17. On the other hand, when the capacity of the combustion chamber 17 is larger than the target capacity, the convex portion 12b is formed on the top portion of the piston 12 except for the outer rim portion and recesses 12a, as in the aforementioned piston 12, so as to decrease the capacity of the combustion chamber 17.

In step S10, a valve model is three-dimensionally built on the basis of the input information associated with the valves 21.

In step S11, a gap (a shortest distance in this embodiment) between each recess 12a of the piston top portion model and the valve model is calculated while the piston 12 and each valve 21 come closest to each other. In step S12, a third result window that displays the gap value and the like is displayed on the display 3. This third result window includes two operation buttons, i.e., next and back buttons, as in the first result window.

It is checked in step S13 if the operation button has been operated. If NO in step S13, i.e., neither the next button nor the back button have been operated, the flow returns to step S12 to continuously display the third result window. If YES in step S13, and the next button has been operated, the flow advances to step S14; if YES in step S13, and the back button has been operated, the flow returns to step S1.

In step S14, the result contents (including the gap, the minimum value of the thickness, input information, built models, and the like) are saved in the storage device 6. In step S15, a saved content confirmation window that allows the designer to confirm the saved contents is displayed on the display 3. This saved content confirmation window includes an end button used to end this process.

It is checked if the end button has been operated. If NO in step S16, the flow returns to step S15 to continuously display the saved contents confirmation window; if YES in step S16, the process ends.

When the designer has made a predetermined start operation using the operation switch 2 to design the shape of the piston 12 using the design support apparatus, the input window is displayed on the display 3. When the designer inputs, in predetermined fields of this input window, information associated with the piston 12, information associated with the valves 21, information associated with the positions and shapes of the piston ring grooves 12c, information associated with the surfaces of the cylinder head 16 that form the combustion chamber 17, and a target compression ratio using the operation switch 2, a 2D recess model is built, and the dimensions of each recess 12a and the like are displayed on the display 3 via the first result window.

When the designer confirms the dimensions and the like of the recess 12a and finds no problem, he or she operates the next button. When the designer finds some problem, he or she operates the back button to display the input window again, and changes and re-inputs some or all pieces of input information.

When the designer has operated the next button on the first result window, a 3D piston model which comprises the recesses 12a and piston ring grooves 12c is built, a minimum value of the thickness between each recess 12a and the piston ring groove 12c in this piston model is calculated, and the calculation result is displayed on the display 3 via the second result window.

When the designer confirms the minimum value of the thickness and finds no problem since this minimum value is equal to or larger than the predetermined value, he or she operates the next button. On the other hand, when the designer finds some problem since the minimum value is smaller than the predetermined value, he or she operates the back button to display the input window again, and changes and re-inputs some or all pieces of input information.

When the designer has operated the next button on the second result window, a piston top portion model is built, and a recess portion or the convex portion 12b is formed on the top portion of the piston 12. This recess portion or the convex portion 12b adjusts the capacity of the combustion chamber 17 to be equal to the target capacity determined by the target compression ratio. Also, a valve model is built, a gap (shortest distance) between each recess 12a of the piston top portion model and that valve model is calculated, and the calculation result is displayed on the display 3 via the third result window.

Assume that the convex portion 12b is formed on the top portion of the piston 12 and is formed around the recesses 12a, as shown in FIG. 19. In this case, since the open end of the recess 12a shifts toward the valve side due to the presence of the convex portion 12b, the gap (shortest distance z') becomes smaller than the shortest distance z upon building the recess model. Therefore, whether or not the gap satisfies the predetermined condition (whether or not the shortest distance z' is equal to or larger than the third reference value) must be confirmed. However, in this embodiment, since the gap (shortest distance z') is displayed on the display 3, the designer can easily confirm whether or not the gap satisfies the predetermined condition.

When the designer confirms the gap and determines that the gap satisfies the predetermined condition, he or she operates the next button. On the other hand, when the designer determines that the gap does not satisfy the predetermined condition, he or she operates the back button to display the input window again, and changes and re-inputs some or all pieces of input information.

When the designer has operated the next button on the third result window, the result contents are saved in the storage device, and the saved contents are displayed on the display 3 via the saved content confirmation window. The designer confirms the saved contents, and then operates the end button to end the process.

(Effect of Second Embodiment)

Therefore, according to this embodiment, after the shape of the top portion of the piston 12 is set so that the capacity of the combustion chamber 17 is equal to the target capacity determined from the target compression ratio, the gap between each recess 12a of the three-dimensionally built piston top portion model and the valve model is calculated. Hence, even when the recess 12a has a complicated shape, the designer can quickly and precisely obtain that gap, and can easily confirm whether or not the gap between the recess 12a and valve 21 satisfies the predetermined condition. In addition, a 3D piston model which comprises the recesses 12a and piston ring grooves 12c is built, and the minimum value of the thickness between each recess 12a and the piston ring groove 12c in this piston model is calculated. Hence, even when the recess 12a has a complicated shape, the designer can also quickly and precisely obtain the minimum value of the thickness, and can confirm on the display 3 whether or not the minimum value is equal to or larger than the predetermined value. Hence, the shape of the piston 12 with the recesses 12a can be efficiently and optimally designed.

In this embodiment, the piston model which comprises the recesses 12a and piston ring groove 12c is built independently of the piston top portion model before building of that piston top portion model, and the minimum value of the thickness between the recess 12a and piston ring groove 12c in the piston model is calculated. Alternatively, the piston model including the piston top portion model is built after building of the piston top portion model, and the gap with the valve model and the minimum value of the thickness may be calculated using this piston model. Even when the piston model is built after building of the piston top portion model, the piston model may be built independently of the piston top portion model. Furthermore, the calculation of the minimum value of the thickness is not always required, but may be omitted.

In place of the calculation of the minimum value of the thickness between the recess 12a and piston ring groove 12c in the piston model, the position of the piston ring groove 12c may be calculated so that the minimum value of the thickness between the recess 12a and piston ring groove 12c in the piston model becomes equal to or larger than the predetermined value. In this case, the designer may input information associated with at least the shapes of the piston ring grooves 12c without their positions. A 3D piston model which comprises the recesses 12a may be built independently of or to include the piston top portion model, and the positions of the piston ring grooves 12c may be calculated based on this piston model and the input information associated with the shapes of the piston ring grooves so that the minimum value of the thickness between the recess 12a in the piston model and the piston ring groove 12c becomes equal to or larger than the predetermined value.

Furthermore, in this embodiment, the designer confirms the gap between the recess 12a of the piston top portion model and the valve model, which is calculated by the design support apparatus, and changes the design by himself or herself. Alternatively, the design support apparatus may change the design. For example, as the process of the CPU 1 of the design support apparatus, after the gap between the recess 12a of the piston top portion model and the valve model is calculated, whether or not the gap satisfies the predetermined condition is checked. If it is determined that the gap does not satisfy the predetermined condition, at least one of the valve thickness and the slope angle of the chamfer 21a formed at a corner portion as an intersection between the recess opposing surface and side circumferential surface in the valve model is changed so that the gap satisfies the predetermined condition, and the valve model is rebuilt. When the valve thickness of the rebuilt valve model is smaller than the prescribed value, the gap between the recess 12a and valve 21 upon building the recess model is changed, and the respective processes, i.e., building of the recess model, building of the piston top portion model, building of the valve model, the calculation of the gap between the recess 12a of the piston top portion model and the valve model, determination of whether or not the gap satisfies the predetermined condition, and rebuilding of the valve model, are repeated. In this way, when the gap between the recess 12a and valve 21 does not satisfy the predetermined condition, the shape of the valve 21 is automatically changed to satisfy the predetermined condition. Hence, the designer can easily cope with such case without changing the shape of the piston 12. Also, the valve thickness can be prevented from being smaller than the prescribed value, and any reliability drop of the valve 21 can be suppressed. Also, the present invention can be applied to an engine having a variable valve mechanism.

Note that the techniques described in the first and second embodiment can be appropriately combined.

As many apparently widely different embodiments of the present invention can be made without departing from the spirit and scope thereof, it is to be understood that the invention is not limited to the specific embodiments thereof except as defined in the appended claims.

What is claimed is:

1. A computer readable medium encoded with a computer program for supporting design of a piston shape of an engine, said program being executed by a computer to perform:
   inputting specification values defining a crown type and shape of a piston;
   reading out an intake-side piston model having an intake-side recess, and an intake valve model from a database, which stores a plurality of intake-side piston models and a plurality of exhaust-side piston models, independently, in accordance with crown types of the piston;
   deforming the intake-side piston model using the specification values input in the inputting, so as to prevent interference between the intake-side recess and the intake valve model;
   further reading out an exhaust-side piston model having an exhaust-side recess, and an exhaust valve model from the database;
   further deforming the exhaust-side piston model using the specification values input in the inputting, so as to prevent interference between the exhaust-side recess and the exhaust valve model; and
   combining the deformed intake-side piston model and the deformed exhaust-side piston model.

2. The computer readable medium encoded with a computer program according to claim 1, wherein the intake-side and exhaust-side piston models are segmented in accordance with symmetry, and
   the deforming includes combining the intake-side and exhaust-side piston models, and mirroring the combined model in accordance with the symmetry.

3. The computer readable medium encoded with a computer program according to claim 1, wherein the specification values include crown types indicating if a surface of the piston on a combustion chamber side has a convex or recess shape.

4. The computer readable medium encoded with a computer program according to claim 1, wherein the deforming includes:
   deforming, when dimensions associated with the entire piston are input as the specification values, both the intake-side and exhaust-side piston models in correspondence with each other.

5. The computer readable medium encoded with a computer program according to claim 1, wherein said program is executed by a computer to further perform displaying a piston model obtained by combining the intake-side and exhaust-side piston models in the deforming while hiding connected surfaces of the intake-side and exhaust-side piston models.

6. The computer readable medium encoded with a computer program according to claim 1, wherein the intake-side recess included in the intake-side piston model and the exhaust-side recess included in the exhaust-side piston model use different shape determination rules upon determining shapes of the intake-side and exhaust-side recesses on the basis of a recess depth input as the specification value.

7. The computer readable medium encoded with a computer program according to claim 6, wherein the inputting includes inputting an intake-side recess depth and an exhaust-side recess depth, and
   the shapes of the intake-side and exhaust-side recesses are determined to have different slopes of bottom surfaces even when identical values are input as the intake-side and exhaust-side recess depths in the inputting.

8. The computer readable medium encoded with a computer program according to claim 6, wherein the inputting includes inputting an intake-side recess depth and an exhaust-side recess depth, and
   the shapes of the intake-side and exhaust-side recesses are determined to have different curvatures of corners formed by bottom surfaces and side surfaces thereof even when identical values are input as the intake-side and exhaust-side recess depths in the inputting.

9. The computer readable medium encoded with a computer program according to claim 6, wherein when the intake-side and exhaust-side recess depths input in the inputting have changed, the shape of the intake-side recess is determined to change at least one of a slope of a bottom surface and a curvature of a corner formed by the bottom surface and a side surface thereof, but the shape of the exhaust-side recess is determined to change neither of a slope of a bottom surface and a curvature of a corner formed by the bottom surface and a side surface thereof.

10. The computer readable medium encoded with a computer program according to claim 1, wherein the inputting includes inputting a target compression ratio as the specification value, and the deforming includes deforming the piston model in accordance with the target compression ratio input in the inputting.

11. The computer readable medium encoded with a computer program according to claim 10, wherein said program is executed by a computer to further perform:

calculating a compression ratio of the piston model deformed in the deforming, and wherein a piston shape closest to the target compression ratio input in the inputting is determined by repeating the deforming and the compression ratio calculation.

12. A computer readable medium encoded with a computer program for supporting design of a piston shape of an engine, said program being executed by a computer to perform:

inputting specification values defining a piston shape;

reading out a main body piston model, which represents a shape of a surface of the piston, from a database, which stores a plurality of main body piston models and a plurality of space models independently;

deforming the main body piston model using the specification values input in the inputting;

further reading out a space model, which represents a space shape to be carved out from the main body model, from the database;

further deforming the space model using the specification values; and carving out the deformed space model from the deformed main body piston model.

13. The computer readable medium encoded with a computer program according to claim 12, wherein the space model includes a skirt inner space model which represents a shape inside a skirt of the piston.

14. The computer readable medium encoded with a computer program according to claim 12, wherein the space model includes a skirt outer space model which represents a shape of a skirt outer surface of the piston.

15. The computer readable medium encoded with a computer program according to claim 12, wherein the space model includes a pin hole space model which represents a shape of a pin hole that receives a pin used to hold a connecting rod.

16. The computer readable medium encoded with a computer program according to claim 12, wherein the inputting includes inputting dimensions of the entire piston as the specification values, and the deforming includes deforming the main body model and the space model in accordance with the dimensions of the entire piston, and shaving the space model from the main body model.

17. The computer readable medium encoded with a computer program according to claim 13, wherein the inputting includes inputting a thickness of the piston as the specification value, and the deforming includes shaving the skirt inner space model from the main body model while laying out the skirt inner space model at a position separated from the main body model by a distance corresponding to the thickness input in the inputting.

18. The computer readable medium encoded with a computer program according to claim 13, wherein the inputting includes inputting dimensions that determine a shape of the skirt inner space model, and a minimum thickness of the piston as the specification values, and the deforming includes producing error information or performing re-deformation when a thickness of a piston model generated by deforming the skirt inner space model in accordance with the specification values input in the inputting, and shaving the skirt inner space model from the main body model becomes not more than the minimum thickness.

19. The computer readable medium encoded with a computer program according to claim 12, wherein the main body model includes an intake-side piston model which includes an intake-side recess formed to prevent interference with an intake valve, and an exhaust-side piston model which includes an exhaust-side recess formed to prevent interference with an exhaust valve, and the deforming includes deforming both the intake-side and exhaust-side piston models and combining the deformed intake-side and exhaust-side piston models.

20. The computer readable medium encoded with a computer program according to claim 19, wherein the intake-side and exhaust-side piston models are segmented in accordance with symmetry, and the deforming includes combining the intake-side and exhaust-side piston models, and mirroring the combined model in accordance with the symmetry.

21. The computer readable medium encoded with a computer program according to claim 13, wherein the inputting includes inputting a target compression ratio as the specification value, the skirt inner space model includes a portion that represents a space shape of a crown back surface, and the deforming includes increasing a curvature of the crown back surface of the skirt inner space model with increasing target compression ratio input in the inputting.

22. The computer readable medium encoded with a computer program according to claim 13, wherein the inputting includes inputting a pin boss gap as the specification value, the skirt inner space model includes a portion that represents a space shape of a crown back surface, and the deforming includes increasing a curvature of the crown back surface of the skirt inner space model with decreasing pin boss gap input in the inputting.

23. The computer readable medium encoded with a computer program according to claim 13, wherein the inputting includes inputting a skirt inner diameter as the specification value, the skirt inner space model includes a portion that represents a space shape of a crown back surface, and the deforming includes increasing a curvature of the crown back surface of the skirt inner space model with decreasing skirt inner diameter input in the inputting.

* * * * *